(12) United States Patent
Hao et al.

(10) Patent No.: US 11,885,039 B2
(45) Date of Patent: Jan. 30, 2024

(54) METHODS FOR PREPARING A MONOLAYER OR FEW-LAYER CRYSTALLINE BLACK PHOSPHOROUS FILM ON A TWO-DIMENSIONAL SURFACE BY FOCUSING A PULSED LASER BEAM ON A BLACK PHOSPHOROUS TARGET

(71) Applicant: THE HONG KONG POLYTECHNIC UNIVERSITY, Hong Kong (CN)

(72) Inventors: Jianhua Hao, Hong Kong (CN); Zehan Wu, Hong Kong (CN)

(73) Assignee: THE HONG KONG POLYTECHNIC UNIVERSITY, Hong Kong (CN)

( * ) Notice: Subject to any disclaimer, the term of this patent is extended or adjusted under 35 U.S.C. 154(b) by 0 days.

(21) Appl. No.: 17/662,099

(22) Filed: May 5, 2022

(65) Prior Publication Data

US 2023/0357953 A1   Nov. 9, 2023

(51) Int. Cl.
| | |
|---|---|
| *C30B 23/06* | (2006.01) |
| *H01L 21/02* | (2006.01) |
| *C30B 29/02* | (2006.01) |
| *H01L 21/78* | (2006.01) |
| *C30B 23/02* | (2006.01) |

(52) U.S. Cl.
CPC .......... *C30B 23/066* (2013.01); *C30B 23/025* (2013.01); *C30B 29/02* (2013.01); *H01L 21/0242* (2013.01); *H01L 21/02521* (2013.01); *H01L 21/02631* (2013.01); *H01L 21/7806* (2013.01)

(58) Field of Classification Search
CPC ..... C30B 23/00; C30B 23/002; C30B 23/005; C30B 23/02; C30B 23/025; C30B 23/06; C30B 23/066; C30B 29/00; C30B 29/02; C23C 14/22; C23C 14/24; C23C 14/28; C23C 14/54; C23C 14/541; H01L 21/0242; H01L 21/02521; H01L 21/02631; H01L 21/7806
USPC .............................. 117/84, 87, 105, 108, 928
See application file for complete search history.

(56) References Cited

U.S. PATENT DOCUMENTS

| | | | |
|---|---|---|---|
| 10,636,654 B2 | 4/2020 | Xia | |
| 10,727,050 B1 * | 7/2020 | Gambin | ............ H01L 21/02645 |

OTHER PUBLICATIONS

Wu, et al. publication entitled "Large-scale growth of few-layer two-dimensional black phosphorous," Nature Materials, vol. 20, pp. 1203-1209 (2021). (Year: 2021).*

(Continued)

*Primary Examiner* — Kenneth A Bratland, Jr.
(74) *Attorney, Agent, or Firm* — S&F/WEHRW

(57) ABSTRACT

Methods for preparing a monolayer or few-layer centimeter-scale crystalline black phosphorus film, products thereof, and electronic and optoelectronic devices including the same.

15 Claims, 21 Drawing Sheets

(56) References Cited

OTHER PUBLICATIONS

Yang, et al. publication entitled "Progress in pulsed laser deposited two-dimensional layered materials for device applications," Journal of Materials Chemistry C, vol. 4, pp. 8859-8878 (2016). (Year: 2016).*

Yijun Xu et al., Epitaxial nucleation and lateral growth of highcrystalline black phosphorus films on silicon, Nat. Commun. 11, 1330 (2020).

Cheng Li et al., Synthesis of Crystalline Black Phosphorus Thin Film on Sapphire, . Adv. Mater. 30, 1703748 (2018).

Zehan Wu et al., Large-scale growth of few-layer two-dimensional black phosphorus, Nature Materials, vol. 20, Sep. 2021, 1203-1209.

* cited by examiner

| No. | Methods | Scale / Thickness | Field-effect mobility ($cm^2V^{-1}s^{-1}$) | Switching ratio | |
|---|---|---|---|---|---|
| 1 | PLD | $10^4$ μm / 5 nm | 213 (RT) <br> 617 (250 K) | ~ $5\times10^3$ | This work |
| 2 | Mechanical exfoliation | 1 μm / 0.85 nm | 286 | ~ $10^4$ | Comparative Methods |
| 3 | Mechanical exfoliation | 5 μm / 10 nm | ~ 100 | ~ $10^4$ | |
| 4 | Liquid exfoliation | 0.8 μm / 12 nm | 0.58 | ~ $10^3$ | |
| 5 | Plasma etching | 20 μm / 3 nm | \ | \ | |
| 6 | RP Conversion | 20 μm / 50 nm | 160 | 9 | |
| 7 | CVD | 100 μm / 600 nm | \ | ~ $10^4$ | |
| 8 | CVT | 20 μm / 10 nm | 1200 | ~ $10^5$ | |

FIG. 17

METHODS FOR PREPARING A MONOLAYER OR FEW-LAYER CRYSTALLINE BLACK PHOSPHOROUS FILM ON A TWO-DIMENSIONAL SURFACE BY FOCUSING A PULSED LASER BEAM ON A BLACK PHOSPHOROUS TARGET

TECHNICAL FIELD

Provided herein are methods for preparing two-dimensional black phosphorous film via pulsed laser deposition, products thereof, and electronic and optoelectronic devices including the same.

BACKGROUND

Two-dimensional (2D) materials provide opportunities for developing semiconductor applications at atomistic thickness that have the potential to overcome the limits of the silicon technology. Black phosphorus (BP), as a layered semiconductor with controllable bandgap and high carrier mobility, is one of the most promising candidates for transistor devices at atomistic thickness. However, the lack of large-scale growth greatly hinders its device development. Here we report the growth of ultra-thin BP in centimeter scale via pulsed laser deposition.

BP, a re-discovered elemental 2D semiconductor, possesses both appealing carrier-mobility and widely tunable bandgap from 0.3 eV in bulk to around 2 eV for monolayer, covering the magnitudes of $E_g$ from conventional semiconductors for transistor devices (e.g. $E_{g,Si}$~1.12 eV, $E_{g,GaAs}$~1.44 eV). Moreover, BP exhibits various unique properties, which are valuable for broad applications ranging from nano-electronics and -photonics to quantum devices and superconductors. Putting them together makes BP an ideal candidate for 2D applications, which could ultimately break through development obstacles and lay the foundation for 2D materials in the information industry. Contrary to its significant application prospects, the controllable large-scale (e.g., wafer-scale) growth of monolayer and few-layer BP films has been a major long-standing problem since the discovery of BP, and the lack of solutions has greatly hindered its further investigations and practical applications.

To date, BP prepared by top-down exfoliation suffers from limited scale and irregular shape. The thus prepared BP size of a thin layer can be on the order of a few micrometers or tens of micrometers in lateral scale, and the exfoliation process does not reliably produce uniform layers of BP.

Red-phosphorus-based allotropic-transformation approaches cannot form high-quality films with atomistic thickness. Moreover, such approaches are limited to BP few-layers on the order of a few micrometers or tens of micrometers in lateral scale.

Recently, chemical vapor deposition (CVD) enabled bottom-up synthesis of BP has been developed, but only few-layer flakes up to dozens of micrometers in lateral scale can be obtained. This might be due to the unique $sp^3$ hybridization of P atoms in BP, which results in a relatively high surface energy than the substrate, hindering the lateral layer-growth of BP. Besides, the construction of BP phase requires extreme high-pressure conditions, which can be extremely difficult to achieve in vapor-phase deposition approaches.

Accordingly, there thus exists improved methods for preparing monolayer and few-layer BP that address at least some of the shortcomings described above.

SUMMARY

Provided herein is a pulsed laser deposition (PLD) strategy to synthesize high-quality monolayer or few-layer BP in centimeter scale. In combination with molecular dynamic (MD) simulations, it is demonstrated that, instead of conventional heat-assisted evaporation, the application of pulsed laser can facilitate the formation of large BP clusters within the transported physical vapor, which significantly reduces the formation energy of BP phase and enables the large-scale growth of monolayer and few-layer BP.

In a first aspect provided herein is a method for preparing a monolayer or few-layer crystalline black phosphorus film, the method comprising:
  a. positioning a substrate in a process chamber, wherein the substrate comprises a two-dimensional deposition surface;
  b. positioning a black phosphorus target in the process chamber a predetermined distance from the substrate; and
  c. focusing a pulsed laser beam of a predetermined energy density on the black phosphorus target to ablate the black phosphorous sample thereby forming a plume comprising phosphorus plasma directed towards the deposition surface thereby forming the monolayer or few-layer crystalline black phosphorus film.

In certain embodiments, the substrate is selected from the group consisting of mica, highly ordered pyrolytic graphite (HOPG), graphene, hexagonal boronitride (BN), SiC, and sapphire.

In certain embodiments, the pressure in the processing chamber is below $1.0 \times 10^{-5}$ Torr.

In certain embodiments, the temperature of the substrate is maintained between 250° C. and 350° C.

In certain embodiments, the laser fluence of the pulsed laser beam is 0.8-5.0 $J/cm^2$.

In certain embodiments, the predetermined distance of the black phosphorus target and the substrate is between 10 and 100 mm.

In certain embodiments, the black phosphorus target is a black phosphorus single crystal.

In certain embodiments, the few-layer crystalline black phosphorus film is between 1-30 layers thick and is uniformly crystalline over an area of 0.1-100 $cm^2$.

In certain embodiments, the method further comprises the step of removing the substrate from the monolayer or few-layer crystalline black phosphorus film.

In certain embodiments, the method comprises:
  a. positioning a substrate in a process chamber, wherein the substrate comprises a deposition surface;
  b. positioning a black phosphorus single crystal target in the process chamber between 20-55 mm from the substrate; and
  c. focusing a pulsed laser beam having a laser fluence between 0.8-1.6 $J/cm^2$ on the black phosphorus single crystal target to ablate the black phosphorous sample thereby forming a plume comprising phosphorus plasma directed towards the deposition surface thereby forming the monolayer or few-layer crystalline black phosphorus film, wherein the pressure of the process chamber is maintained between $1.0 \times 10^{-10}$ Torr and $1.0 \times 10^{-5}$ Torr.

In certain embodiments, the black phosphorus single crystal target in the process chamber between 30-40 mm from the substrate.

In certain embodiments, the laser fluence is between 1.0-1.5 J/cm$^2$.

In certain embodiments, the temperature of the substrate is maintained between 250° C. and 350° C.

In a second aspect, provided herein is a method for preparing a few-layer crystalline black phosphorus film, the method comprising:
  a. positioning a [KMg$_3$(AlSi$_3$O$_{10}$)F$_2$ substrate in a process chamber, wherein the [KMg$_3$(AlSi$_3$O$_{10}$)F$_2$ substrate comprises a deposition surface;
  b. positioning a black phosphorus single crystal target in the process chamber between 30-40 mm from the [KMg$_3$(AlSi$_3$O$_{10}$)F$_2$ substrate; and
  c. focusing a pulsed laser beam having a laser fluency between 1.0-1.5 J/cm$^2$ on the black phosphorus single crystal target to ablate the black phosphorous sample thereby forming a plume comprising phosphorus plasma directed towards the deposition surface thereby forming the few-layer crystalline black phosphorus film, wherein the few-layer crystalline black phosphorus film is between 2-6 layers thick and is uniformly crystalline over an area of 1 cm$^2$, and wherein the pressure of the process chamber is maintained between $1.0 \times 10^{-10}$ Torr and $1.0 \times 10^{-8}$ Torr.

In certain embodiments, the temperature of the [KMg$_3$(AlSi$_3$O$_{10}$)F$_2$] substrate is maintained between 275° C. and 325° C.

In a third aspect, provided herein is a monolayer or few-layer crystalline black phosphorus film prepared according to the method of the first aspect, wherein the monolayer or few-layer crystalline black phosphorus film is between 1-10 layers thick and is uniformly crystalline over an area of 1 cm$^2$.

In a fourth aspect, provided herein is an electronic or optoelectronic device comprising the monolayer or few-layer crystalline black phosphorus film of the third aspect.

In certain embodiments, the electronic device is a field-effect-transistor.

In certain embodiments, the electronic device is a semiconductor.

BRIEF DESCRIPTION OF THE DRAWINGS

The above and other objects and features of the present disclosure will become apparent from the following description of the disclosure, when taken in conjunction with the accompanying drawings.

C., 300° C. and 350° C. refer to growth temperature, while 'NC' and 'RC' refer to 'natural cooling' and 'rapid cooling', respectively. The dashed gray-curve exhibits Raman spectrum of bulk BP crystal as reference. BP films grown at 300° C. with rapid-cooling strategy possess optimal Raman characteristics corresponding to $A^1_g$ mode (~360 cm$^{-1}$), $B_{2g}$ mode (~432 cm$^{-1}$), and $A^2_g$ mode (~470 cm$^{-1}$). The coincidence of Raman fingerprints with typical lattice vibration mode strongly evidences the crystalline nature of obtained BP film. In contrast, samples prepared under identical temperature without rapid cooling exhibit Raman characteristics of amorphous phosphorus. This can be attributed to the deterioration of crystalline BP induced by excess heat in natural cooling process. Notably, higher substrate-temperature further increases the deterioration rate, and even leads to evaporation of phosphorus from the substrate (azure line with barely any Raman signal).

Figure 6:
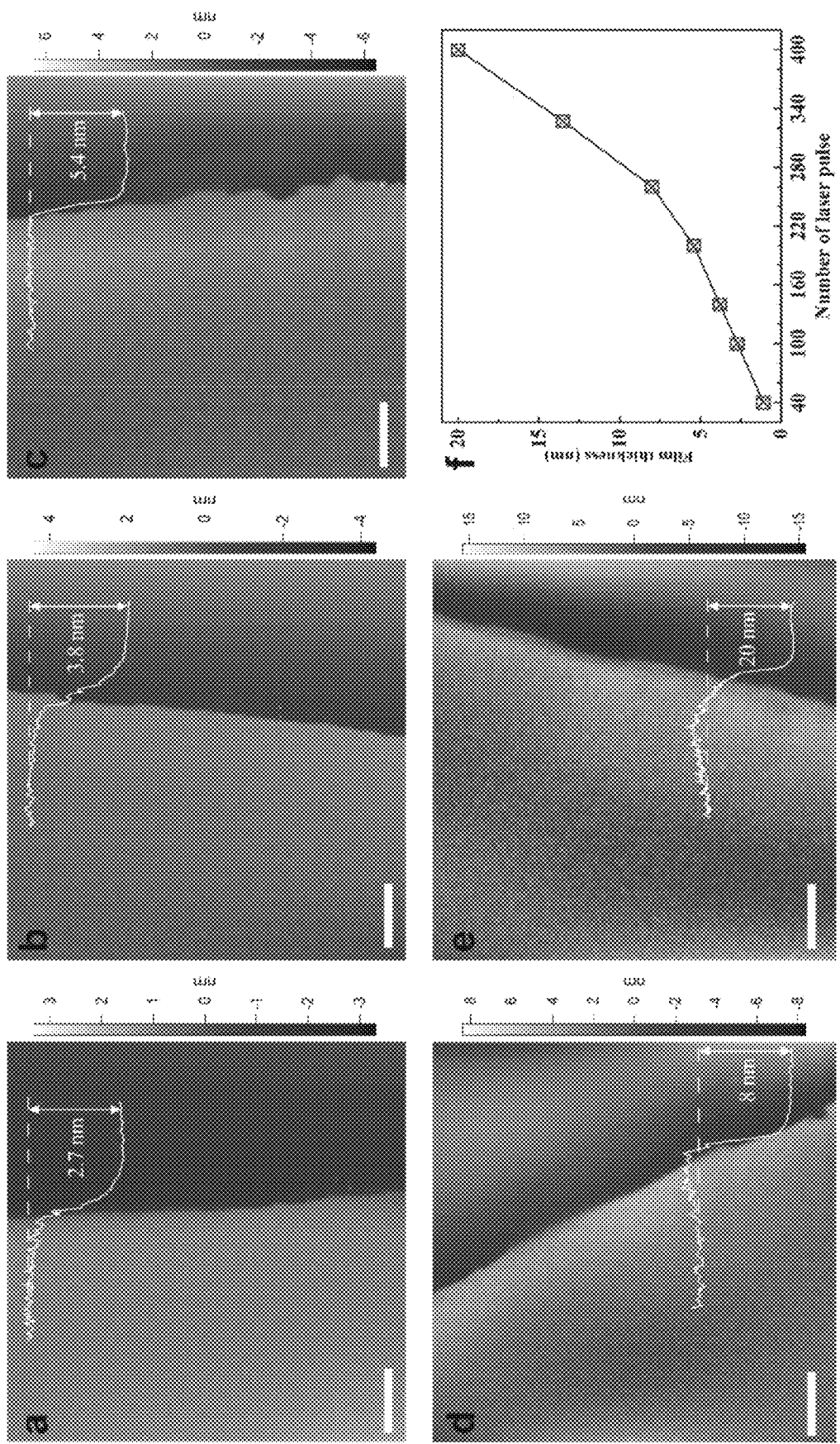

FIG. 6 depicts control synthesis of BP films with various thickness. (A)-(E), Atomic force microscope (AFM) images indicating the thicknesses of BP films synthesized with different number of laser pulses: 100, 140, 200, 260 and 400, respectively. Scale bars: 6 μm. (F) The relationship between the number of laser pulse and the resulting film-thickness. A turning point of BP-film growth mode is observed at ~5 nm. When the layer number is below 10 (i.e., thinner than ~5.3 nm), the BP ultrathin films exhibit flat surface morphology in (A)-(C). In this case, a direct linear relationship can be derived between layer number and laser-pulse number, yielding a growth rate of ~1.3 Å/s. In contrast, the growth rate increases abruptly as the film grows thicker, and some ridge-like undulations start to appear in (D)-(E). This can be attributed to the crystallinity deterioration that gradually occurs under relatively high temperature of 300° C.

Figure 7:
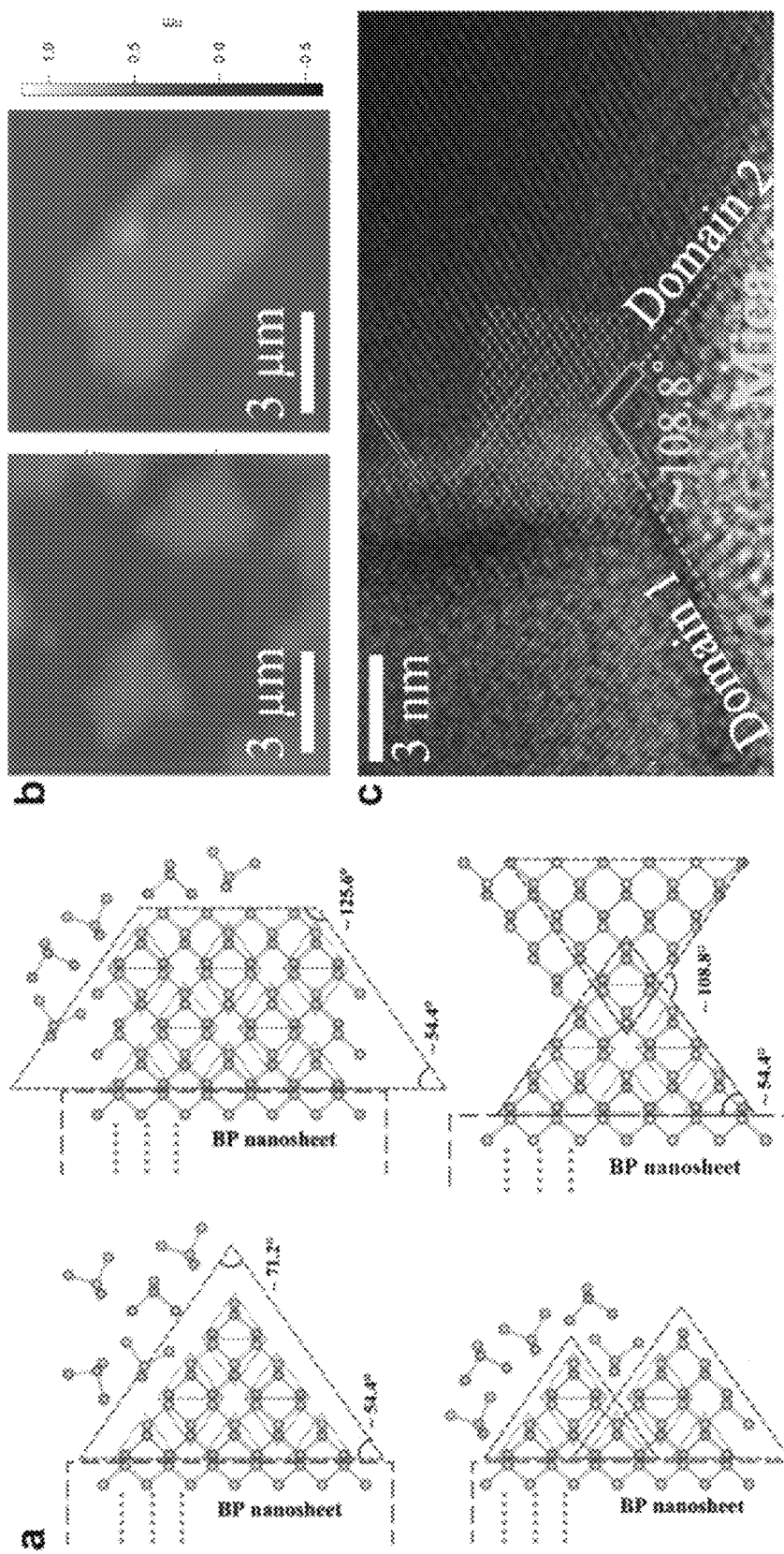

FIG. 7 depicts layer growing and sheet merging process of monolayer BP. (A) Schematic representation of domain-formation and sheet-merging process during lateral growth of BP. Pink balls refer to upper-group atoms in monolayer BP, while purple balls refer to lower-group atoms. The small dotted-triangles label the typical $P_4$ units in BP structure, and the bigger dotted triangles and quadrilaterals mark the formed domain shape of BP nanosheets. This qualitative model is established according to the atomic arrangement in monolayer BP and the principle of crystal growth. Owing to lower edge-free-energy, the zigzag edge of nanosheet is more conducive to the growth and merging of two-dimensional (2D) crystals. Starting from one of the zigzag edges in BP nanosheet, phosphorus clusters are connected one by one, which enables the lateral layer-growth of BP film. It is worth noting that, due to the puckered structure in double-atomic-layer BP, the formed triangles are not equilateral triangles like those in graphene or transition metal dichalcogenides, but rather isosceles triangles with angles of about 54.4°, 54.4° and 71.2°, respectively. Accordingly, BP sheets with typical domain shape of triangle or trapezoidal are formed, and similarly, these sheets will further merge into large-area film on the substrate. (B) Observation of triangle- and trapezoidal-like sheets of monolayer BP. The dotted triangles mark the domain shape of BP sheets. (C) High-resolution transmission electron microscope (HR-TEM) image showing the region where two BP grains merge. No obvious grain boundary can be seen, and the observed inclined angle is close to that in conjecture.

Figure 8:
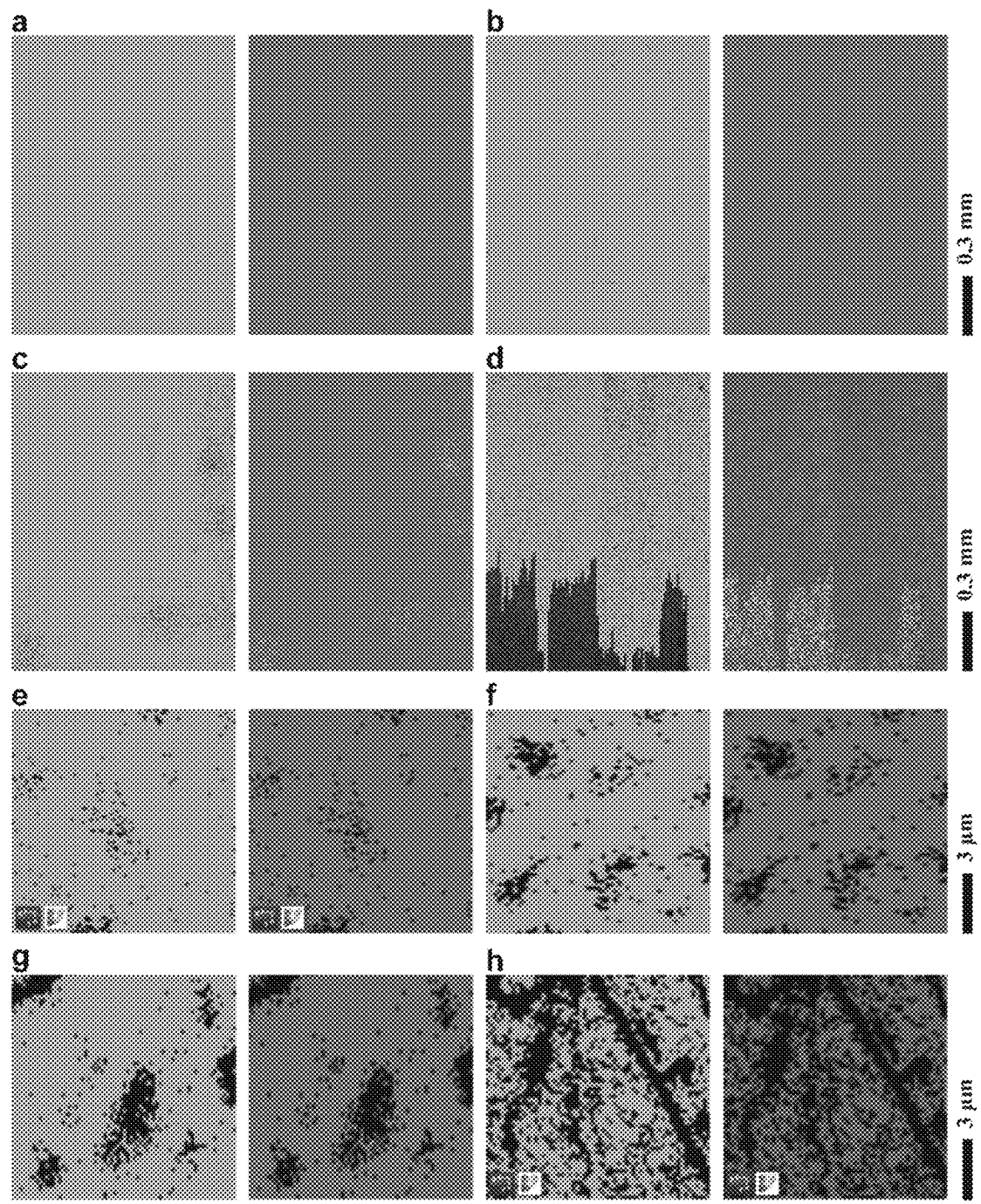

FIG. 8 depicts large-area electron back-scatter diffraction (EBSD) investigation on the BP films. (A)-(D) Millimeter-scale EBSD mapping results of BP films with layer number of 10, 12, 15 and 30, respectively. The corresponding micrometer-scale EBSD mapping results are shown in (E)-(H), respectively. In each figure, the left and right sub-images are Inverse pore figures along z-axis (IPF-Z) and y-direction (IPF-Y) results, respectively. According to the differential color matching of IPF (inset of (E),(H)), crystallographic orientations of the investigated sample can be concluded. Black color in the image represents regions where the diffraction signal cannot be resolved and no accurate crystallographic orientations can be concluded. The black regions may be resulted from various circumstances including amorphous phosphorous, oxidized phosphorous, or obscure grain boundaries between highly aligned domains. For few-layer samples in (A) and (B), as well as FIG. 2A-B in main text, the black regions are mainly composed of indistinct grain boundaries between highly aligned domains because they have smaller quantity and more scattered distribution. Accordingly, high crystalline quality with homogenous crystal-orientation in large-scale few-layer BP films can be concluded. For the thicker samples, fingerprints for unaligned domain become denser, and degradation on crystal quality can be observed, which implies the effect of excessive growth time on crystal quality. These results are consistent with the observation under TEM, which will be further illustrated in Supplementary FIG. 10.

Figure 9:
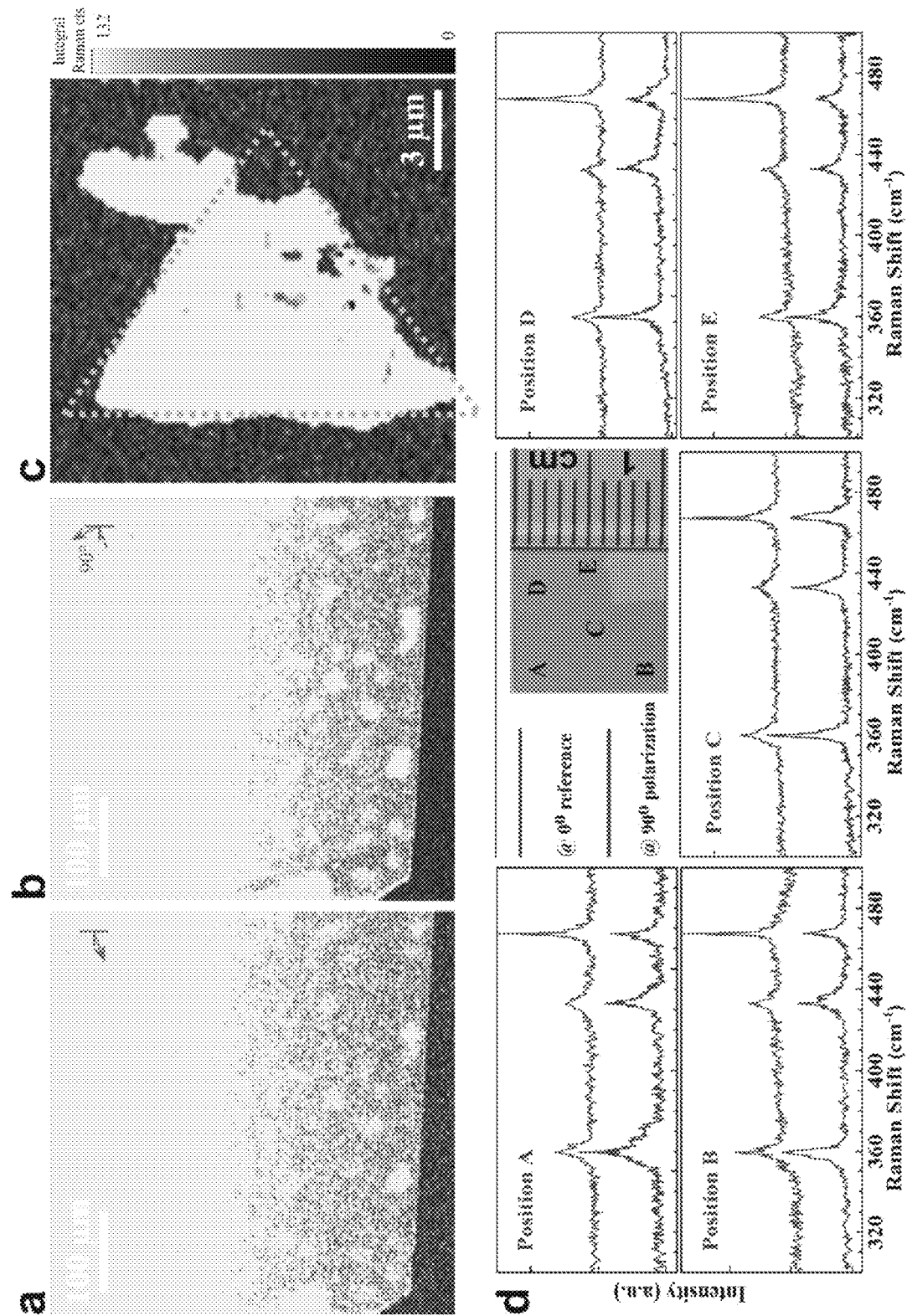

FIG. 9 depicts Raman mapping investigations of few-layer BP films. (A)-(B), Large-scale polarized Raman mapping results on integrated intensity of BP $A^2_g$ peak along two characteristic reference directions, 0° and 90°, respectively, on a ~3-layer BP film. The area with low Raman counts in lower right corner of each image represents mica substrate. In such ultra-thin samples, some non-uniformly oriented BP domains can only be observed at sample edges and homogeneous growth of crystalline BP is realized in central region of the film. (C) 90°-polarized Raman mapping result on integrated intensity of BP $A^2_g$ peak on a monolayer triangle-like BP flake. (D) Polarized Raman characteristics of five randomly distributed positions across a ~5-nm BP sample. The polarization angle 90° is relative to the 0° reference, which is initially determined to be the angle with the highest intensity of $A^2_g$ mode at position C. Five measured positions are shown in the inserted photograph.

Figure 10:
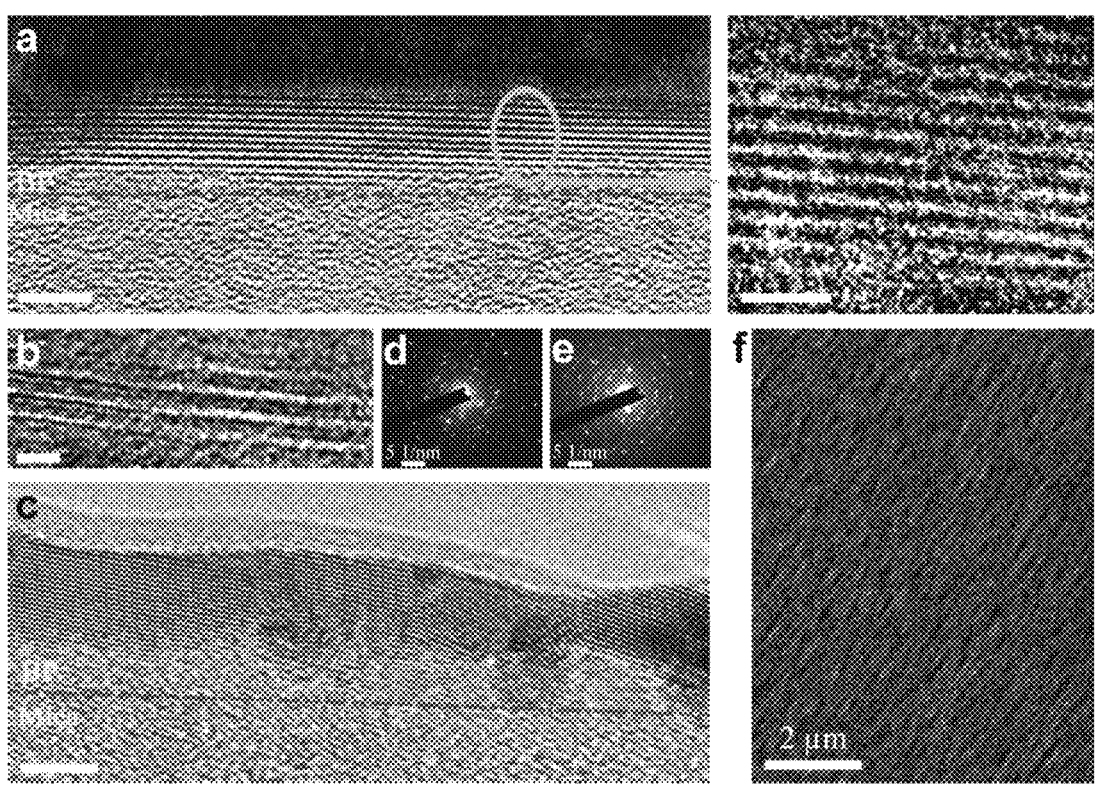

FIG. 10 depicts TEM investigations of BP films with different thickness. (A) Cross-sectional TEM image of an ~11-layer BP film. In contrast to the distinct stratification of BP layers, the interface (pink dashed-line) between mica substrate and BP film is relatively vague, where the structure deterioration of adjacent BP-layers can be observed. (B) Cross-sectional TEM image of a tri-layer BP film. On its surface, a small fragment belonging to the fourth BP layer is growing. (C) Cross-sectional TEM image of a thicker BP sample with layer number of ~20, which has uneven thickness varying from ~12 nm to ~20 nm and misalignments of BP lattice caused by the astatic movement of the underlying amorphous layer. Specifically, while the upper layers of BP continue to grow, the bottom layers gradually become amorphous under high temperature. (D)-(E) The selected-area electron diffraction (SAED) patterns of a ~15-layer BP film and another ~20-layer sample, respectively. It can be recognized that misalignments of BP lattice are gradually emerging, indicating a crystallinity deterioration tendency that gradually occurs in thicker samples, in consistent with previous EBSD results. (F) Scanning electron microscope (SEM) image showing the surface morphology of a ~3-layer BP film. Ripples in similar direction can be observed. Surface ripples are quite common for ultrathin 2D films that grow laterally, and there is a high correlation between the direction of ripples and the crystal orientation of BP film. Scale bar: (A) 5 nm (2 nm for inset); (B) 1 nm; (C) 8 nm.

Figure 11:
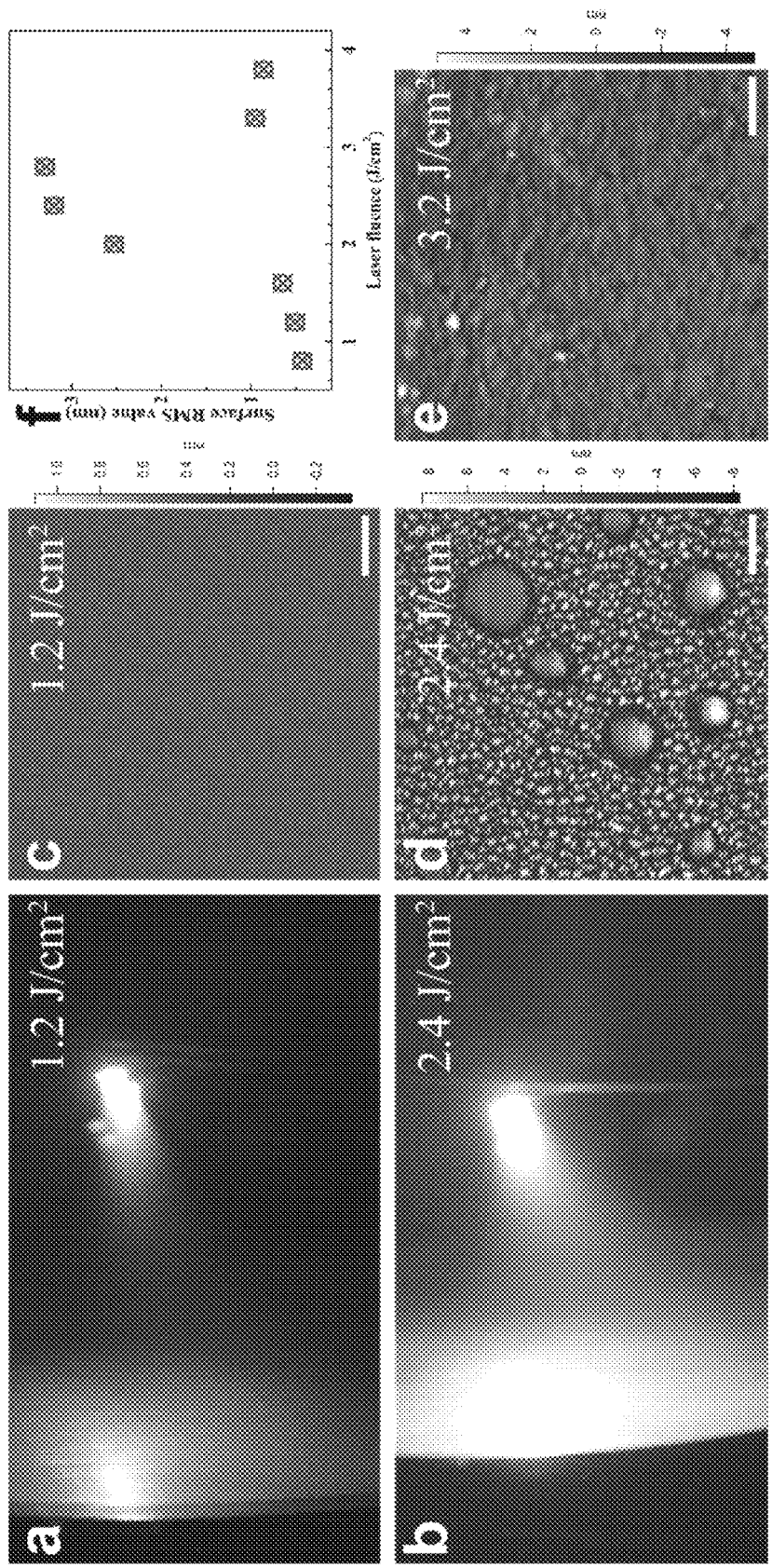

FIG. 11 depicts experimental observations on the growth mode variation with different laser fluence. (A)-(B) Photographs of phosphorus plasma plume generated by pulsed laser with laser fluence of 1.2 and 2.4 J/cm$^2$, respectively. Under low-energy laser conditions, the cone-shaped plasma plume in tawny expands uniformly toward the substrate surface. In contrast, when higher laser fluence is employed, a glowing violet color starts to appear, indicating the existence of scattered phosphorus ions produced by intense ablation. In this case, the ionized phosphorus possesses higher initial kinetic energy, greatly hindering the formation of BP clusters within the plasma activated region. (C)-(E), AFM images showing the film-surface morphology resulting from different laser conditions of 1.2, 2.4 and 3.2 J/cm$^2$, respectively. Under high-energy laser, an excessive number of scattered phosphorus ions is vapor-transported to the substrate surface region, where the high-pressure condition is absent. Owing to the lack of premise for epitaxial growth, only islands with unequal size, or non-uniform phosphorus film with random accumulations can be obtained. Scale bars: 6 μm. (F) Relationship between the laser fluence of introduced pulsed laser and the surface root-mean-square (RMS)-value of obtained films.

Figure 12:
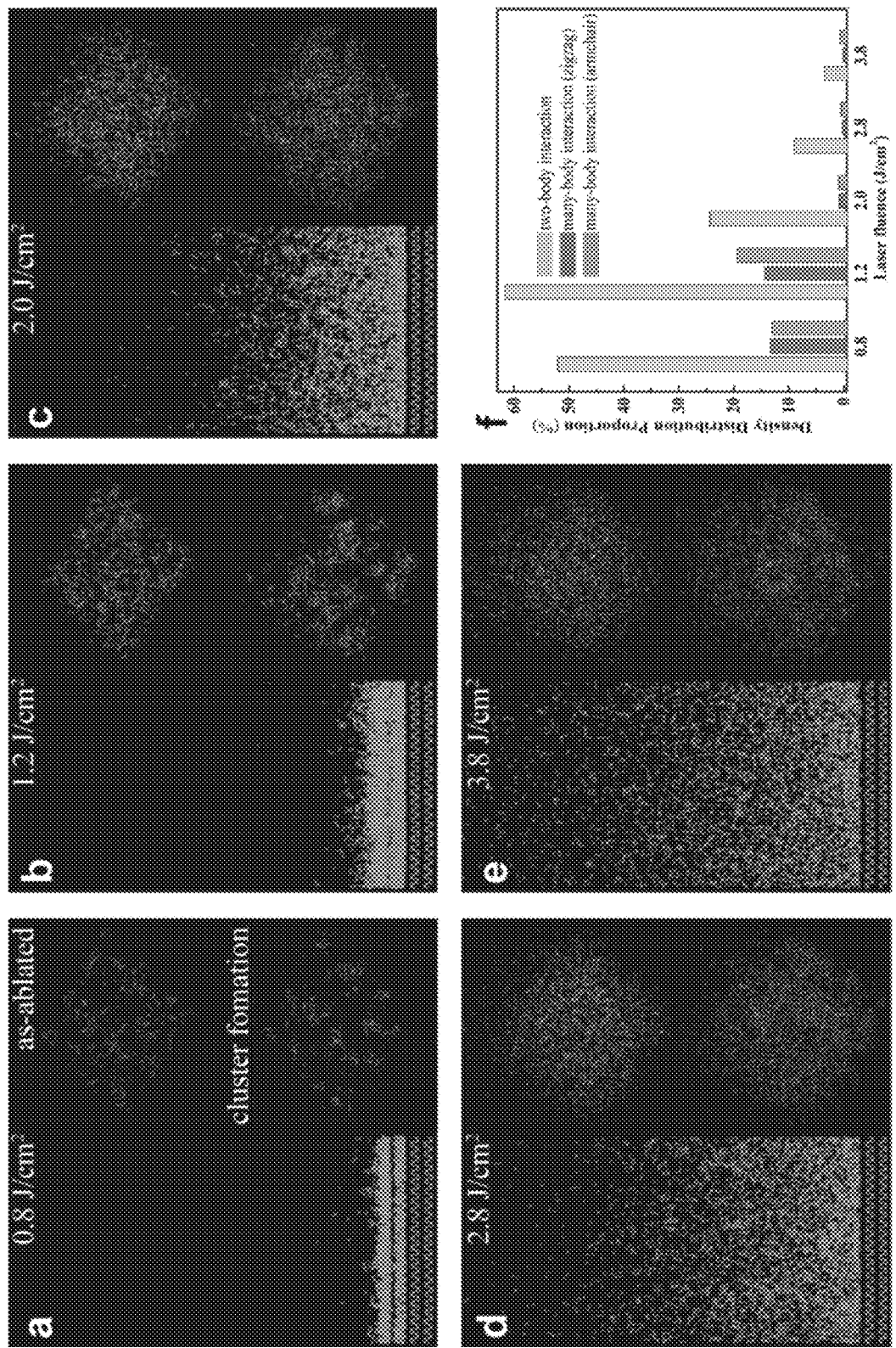

FIG. 12 depicts theoretical studies on the film-growth mechanism under different laser conditions. (A)-(E) Molecular dynamic (MD) simulation results showing the impact of laser fluence on the formation of BP clusters under 0.8, 1.2, 2.0, 2.8, and 3.8 J/cm$^2$ laser, respectively. In each image, the left, upper right, and lower right sub-images show snapshots of bulk-BP source under laser influence, plasma cloud containing as-ablated phosphorus ions, and the final structure of phosphorus segments after evolution in plasma cloud, respectively. (F) Density distribution proportion of different inter-P-atomic interactions extracted from the integrated intensity of RDF peaks under varying laser fluence. See more details in Methods.

Figure 13:
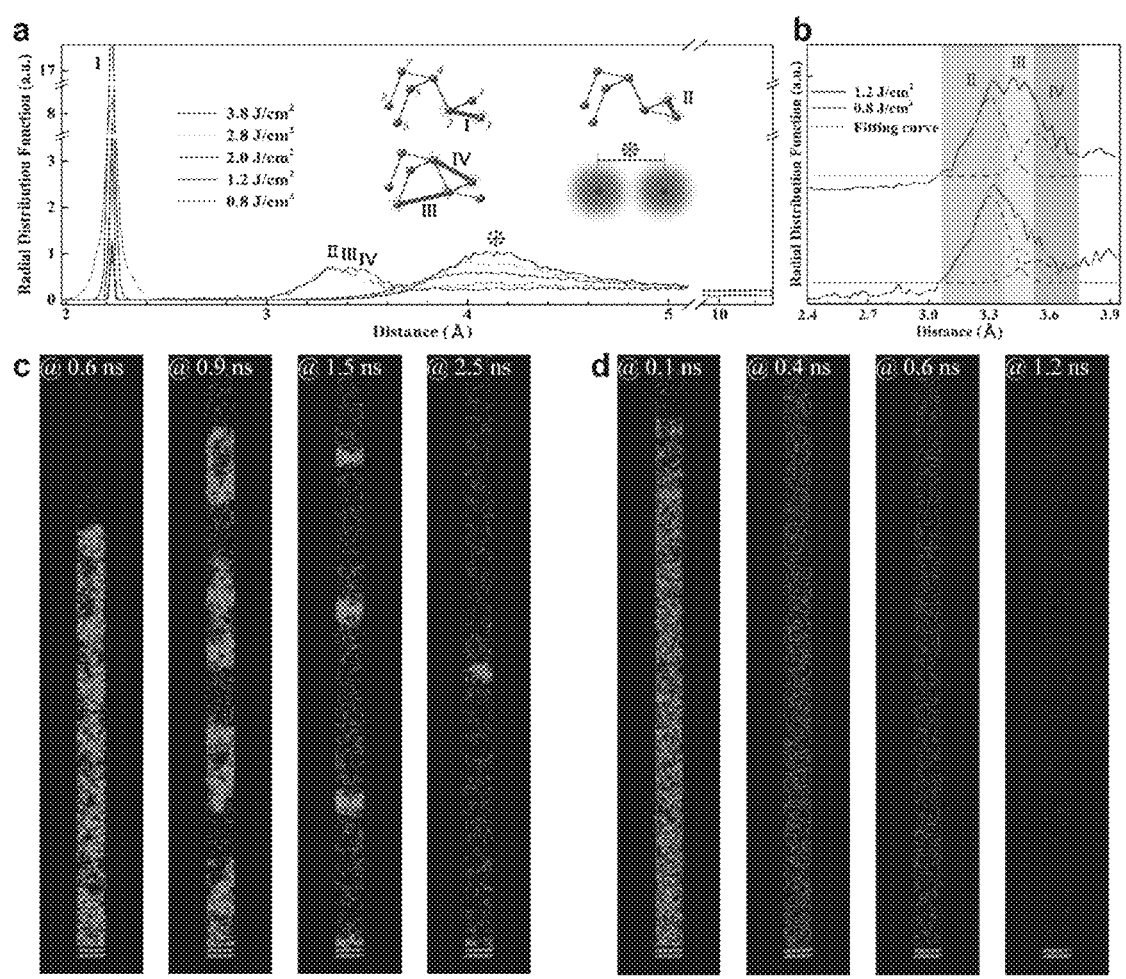

FIG. 13 depicts MD simulation on the effect of laser fluence during PLD process. (A) RDF curves extracted from MD simulation with varying laser fluence. Four characteristic peaks (I-IV) are responsible for the fingerprints of BP allotrope, which renders the distinction between different phosphorus allotropes. The flat peak centered at ~4.15 Å represents vdW-interaction between P atoms without chemical bonding. Differentiation and imitating of the broad peaks centered at ~3.40 Å are shown in (B). (C)-(D), Time-resolved snapshots of MD simulation results showing the ablation process of BP clusters from target surface in one complete laser pulse under optimal and excessive laser fluence, respectively. Consistent with the observations in picosecond-scale simulation, optimal energy laser results in more segments with BP structure, while excessive energy laser leads to more scattered P ions.

Figure 14:
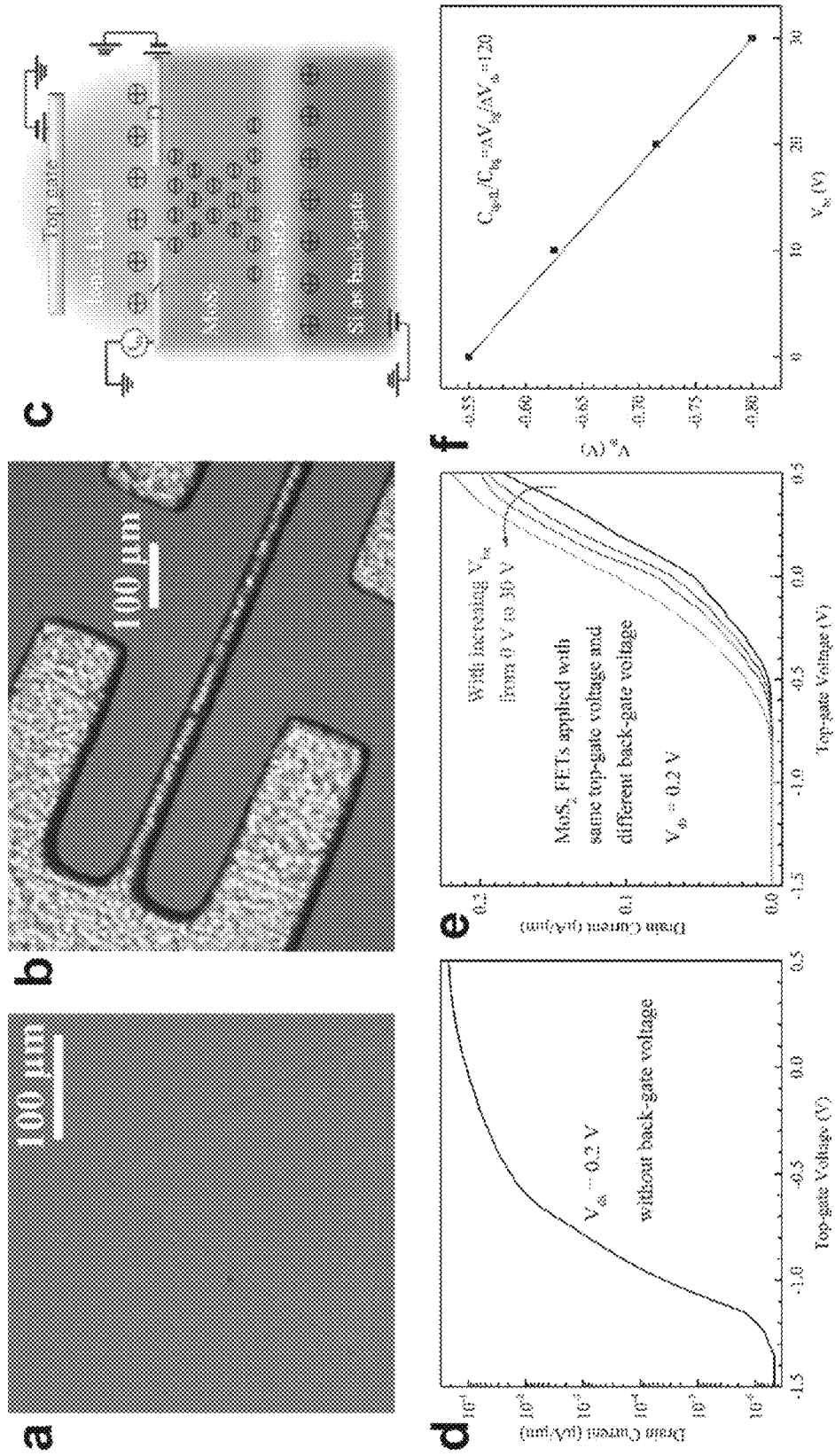

FIG. 14 depicts determination on the capacitance density of used ionic liquid droplet. (A) Optical image of MoS$_2$ triangle nanosheet grown by chemical vapor deposition (CVD). (B) Optical image of hard mask used for fabricating devices. (C) Structure schematic of multi-gated FETs based on CVD-grown MoS$_2$ triangle. Ionic liquid in prescribed dosage is used as top-gate dielectric, and 300-nm-thick SiO$_2$ layer is used as back-gate dielectric. (D) Transfer characteristic curve of top-gated MoS$_2$FET without back-gating. (E) Transfer characteristic curves of the same top-gated MoS$_2$ FET with various back-gate voltage. Clear modulation effects can be observed. (F) Relationship between different back-gate-voltage and the resulting threshold voltage, by which capacitance of the ionic liquid in per unit area can be estimated.

Figure 15:
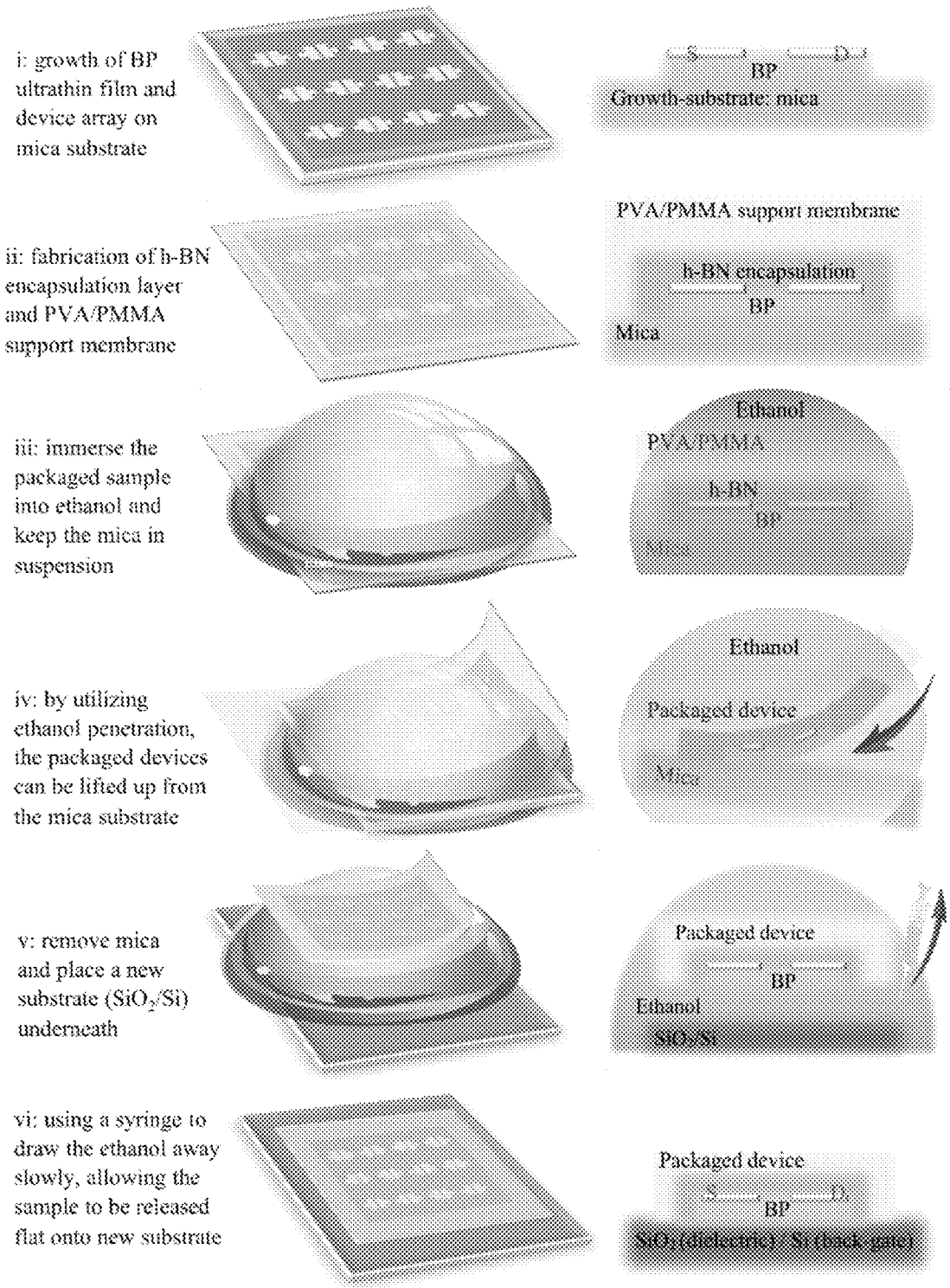

FIG. 15 depicts an overview of the construction process of back-gated BP FETs through encapsulated transfer in accordance with certain embodiments described herein.

Figure 16:
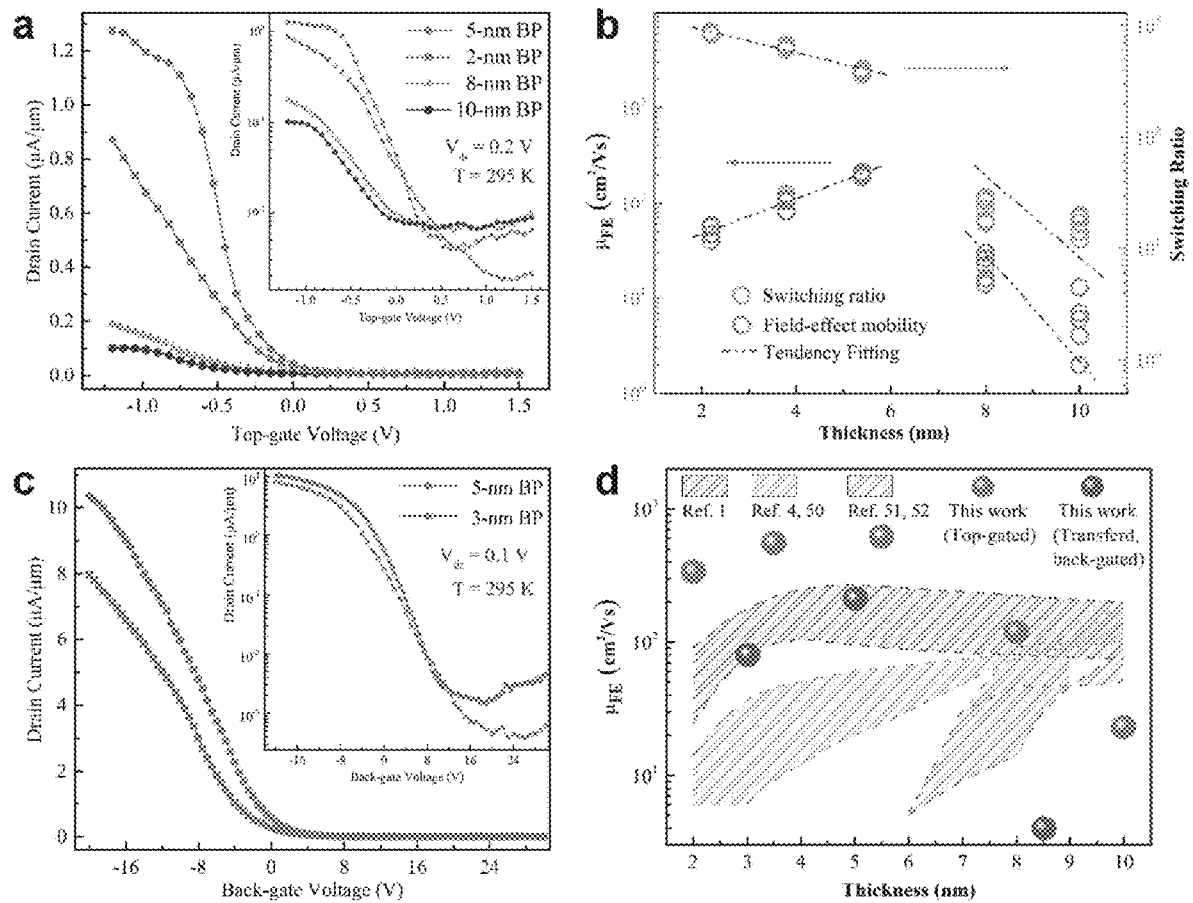

FIG. 16 depicts electrical performance of BP-film-based FETs. (A) Transfer characteristics of the top-gated FETs based on 2-, 5-, 8-, and 10-nm BP ultrathin films in linear scale at room temperature (RT). The inset shows the results in logarithmic scale. (B) The field-effect mobility and switching ratio of the FETs as a function of BP-film thickness based on (A) and further repetitive experiments. These transfer characteristics imply that the devices based on our large-scale few-layer BP films perform well at RT, which provides great possibilities for real applications in information industry. (C) RT Transfer characteristics of the back-gated metal-oxide-semiconductor FETs (MOSFETs) based on 3- and 5-nm BP ultrathin films with 290-nm SiO$_2$ dielectric. Results in linear and logarithmic scale are shown in main figure and the inset, respectively. (D) $\mu_{FE}$ dataset of our work as a function of the thickness of few-layer BP films, comparing with the results from other references, is shown. Here, the mobility values of our work are based on the measured results of multiple devices. Specifically, data of ~2-nm, ~3.8-nm, ~5.4-nm, ~8-nm and ~10-nm-BP-based top-gate devices are derived from over 20 devices for each, while data of ~3-nm, ~5-nm-BP-based back-gate devices are derived from 4 and 9 devices, respectively. Besides, three filled areas shown in the figure are abstracted from the digitized data in referenced literatures. The error bars of these values are associated with different drain-voltages during the device characterization, as well as respective measuring-temperatures.

FIG. 17 depicts comparisons on electrical characteristics and sample scale of BP synthesized by various methods.

Figure 18:
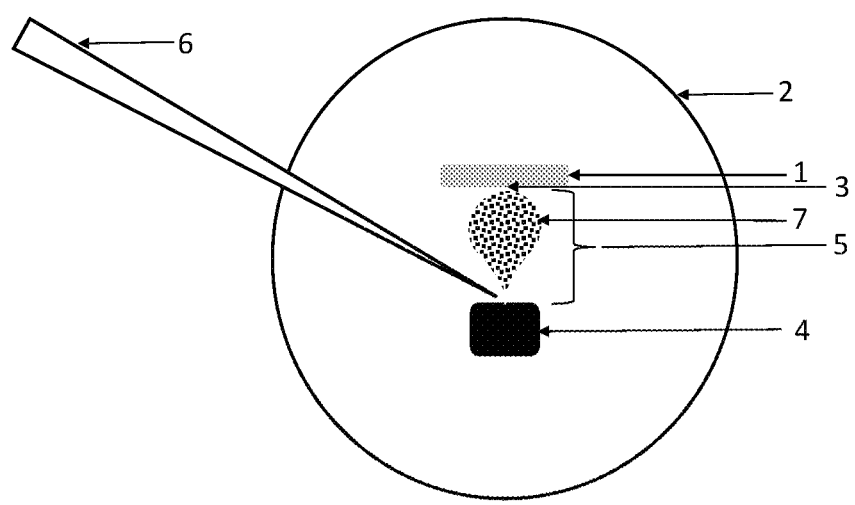

FIG. 18 depicts an exemplary schematic of a PLD system used in connection with certain embodiments described herein.

DETAILED DESCRIPTION

Figure 1:
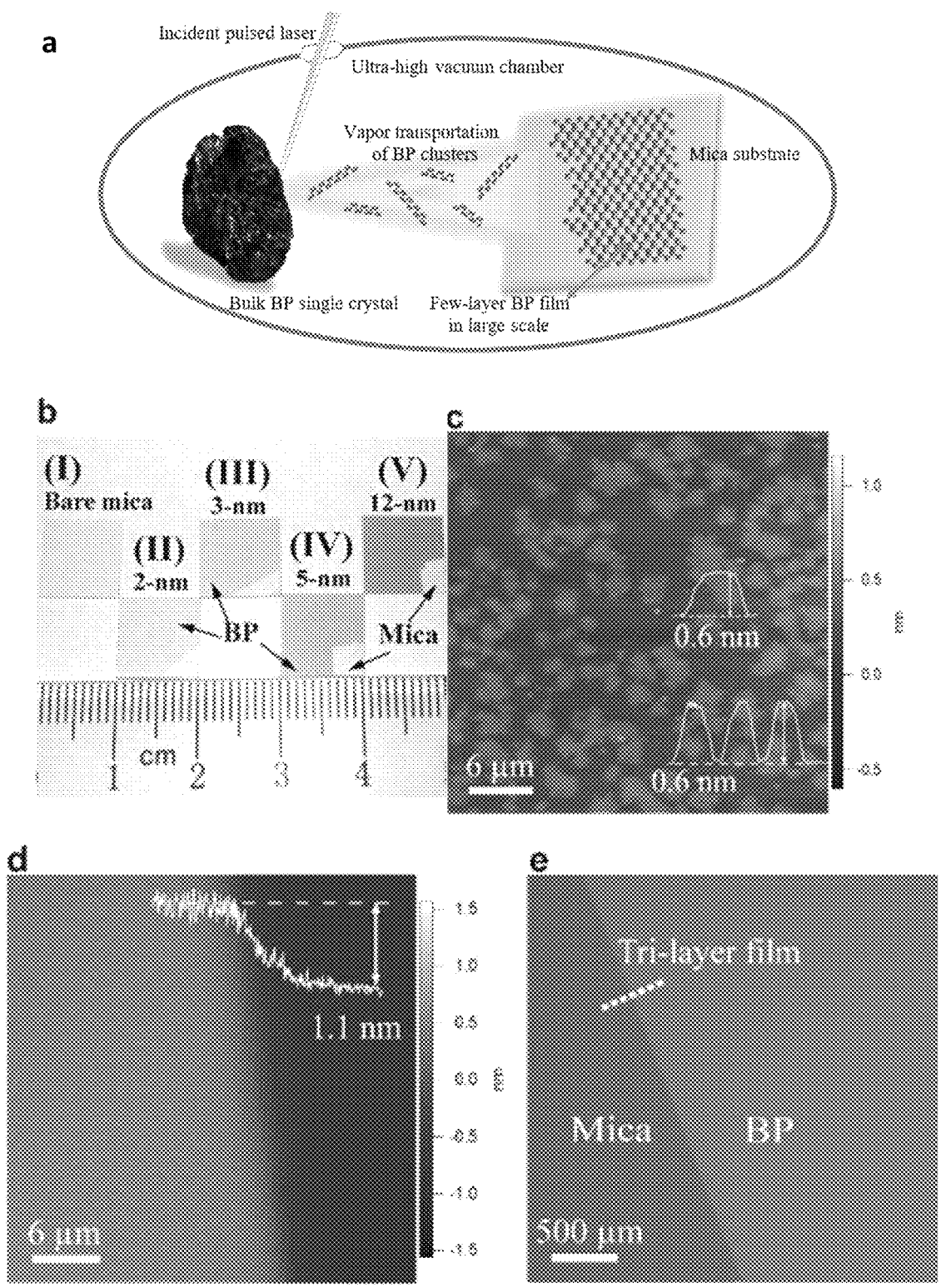
FIG. 1 shows growth of centimeter-scale few-layer BP films. (A) Schematic of controlled PLD process for monolayer or few-layer BP film fabrication. (B) Photographs of bare mica (I) and as-deposited centimeter-scale BP films with different thickness (II-V), respectively. (C) AFM image showing the topography of monolayer BP flakes synthesized with a few laser pulses. The monolayer thickness is indicated by the inserted height profile. (D) AFM image indicating the thickness of a bilayer BP film. (E) Electron back scatter (EBS) image of a tri-layer BP film on mica substrate showing the uniformity and continuity surpassing millimeter scale. (F)-(G) EDX spectrum and element mapping of a ~10-layer BP sample taken under HAADF-TEM, respectively. High elemental purity can be recognized. The inset is the image of scan region (H) XPS spectrum of P 2p on a ~10-layer BP film. High proportion of chemical bonding states related to typical P—P bonds can be observed. (I) XRD spectrum of as-synthesized BP. Peaks corresponding to typical orthorhombic structure of BP are dominant.
Figure 1:
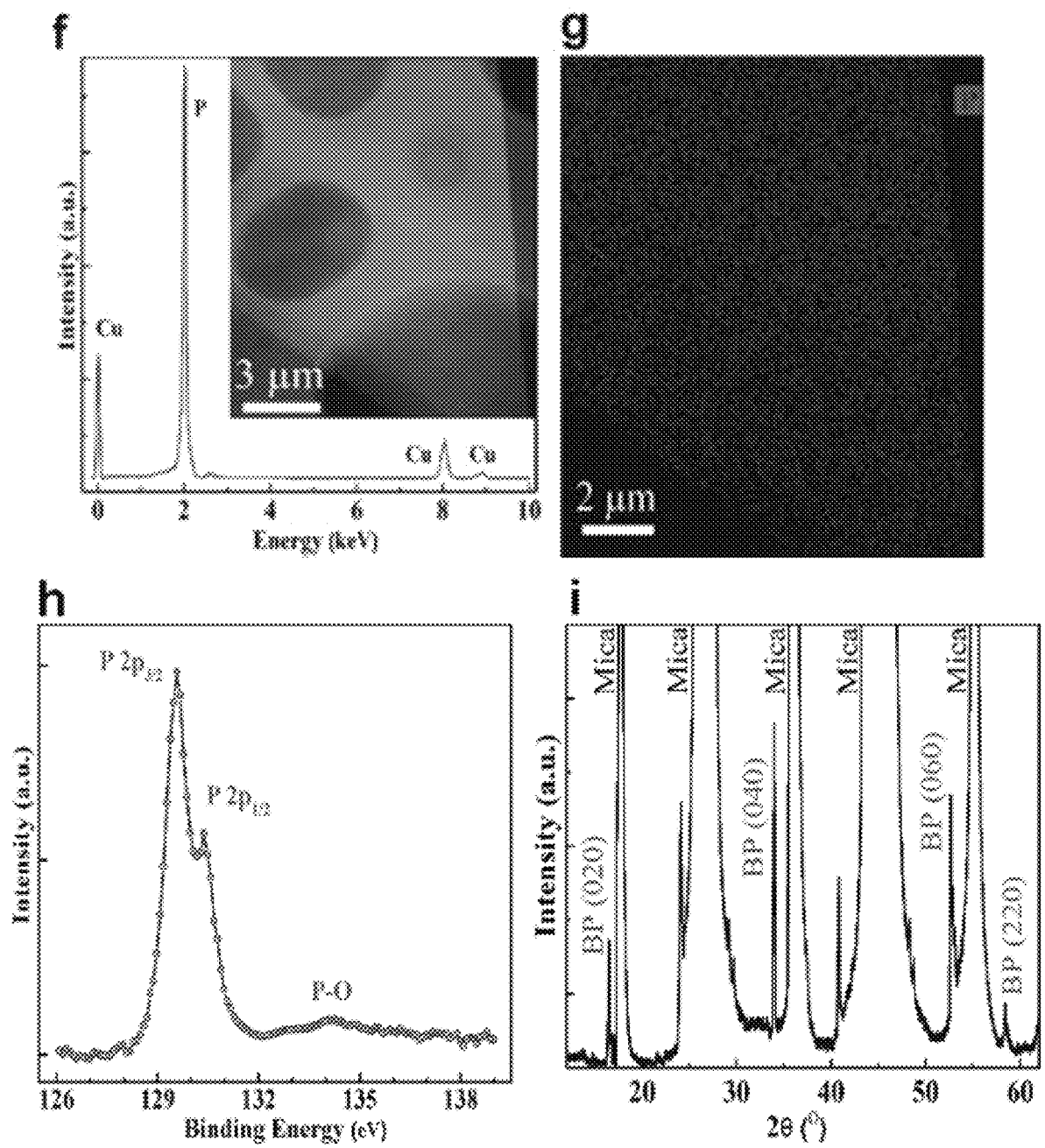

The method described herein involves the deposition of a black phosphorous film on the surface of a substrate using pulsed laser deposition (PLD). In this method, a pulsed laser beam can be focused on a black phosphorous sample. Due to the high power density of the focused laser pulses, the material on the black phosphorous sample is ablated to form a plasma that is deposited on the substrate surface (as illustrated in FIG. 1A). Both the black phosphorous sample and the substrate can be installed in a processing chamber, and their operations can be controlled, e.g., by a feedthrough mechanism. Advantageously, the method described herein can produce ultra-thin crystalline black phosphorus (e.g., on the order of a single layer to 30 layers or more) on wafer-scale (e.g., from 0.1 cm$^2$ to 200 cm$^2$), which can be used in the industrial scale manufacturing of crystalline black phosphorus films.

FIG. 18 depicts a schematic of an exemplary PLD system useful for conducting certain embodiments of the methods described herein, wherein the method for preparing a monolayer or few-layer crystalline black phosphorus film can comprise: positioning a substrate (1) in a process chamber (2), wherein the substrate comprises a two-dimensional deposition surface (3); positioning a black phosphorus target (4) in the process chamber a predetermined distance (5) from the substrate; and focusing a pulsed laser beam (6) of a predetermined energy density on the black phosphorus target to ablate the black phosphorous sample thereby forming a plume (7) comprising phosphorus plasma directed towards the deposition surface thereby forming the monolayer or few-layer crystalline black phosphorus film.

The most widely used pulsed laser source among PLDs is the excimer laser. An excimer laser has a pulse width of several nanoseconds (ns) and a wavelength in the UV region. Its laser fluence (energy range density) can range from a few J/cm$^2$ for a typical 10 mm$^2$ focused area.

The wavelength of the laser can be between 200-380 nm, 300-380, 320-360 nm, 340-380 nm, 200-360 nm, 200-340, 200-320 nm, 200-300 nm, 220-280 nm, 240-260 nm, or 245-255 nm. In the examples below, the laser has a wavelength of about 248 nm.

The repetition rate of laser can range between 1-20 Hz, 1-15 Hz, 1-10 Hz, or 3-7 Hz. In the examples below, the repetition rate of the laser is about 5 Hz.

The method can comprise between 1-400 laser pulses. In certain embodiments, the method comprises 50-400, 50-350, 50-300, 50-250, 50-200, 100-200, 100-140, 100-400, 100-260, 140-260, 200-400, 260-400, or 200-260 pulses.

In certain embodiments, the laser fluence is between 0.8-4.0 J/cm$^2$, 0.8-3.8 J/cm$^2$, 0.8-3.6 J/cm$^2$, 0.8-3.4 J/cm$^2$, 0.8-3.2 J/cm$^2$, 0.8-3.0 J/cm$^2$, 0.8-2.8 J/cm$^2$, 0.8-2.6 J/cm$^2$, 0.8-2.4 J/cm$^2$, 0.8-2.2 J/cm$^2$, 0.8-2.0 J/cm$^2$, 0.8-1.9 J/cm$^2$, 0.8-1.8 J/cm$^2$, 0.8-1.7 J/cm$^2$, 0.8-1.6 J/cm$^2$, 0.8-1.5 J/cm$^2$, 0.8-1.4 J/cm$^2$, 0.8-1.3 J/cm$^2$, 0.8-1.2 J/cm$^2$, 0.9-1.4 J/cm$^2$, 1.0-1.4 J/cm$^2$, 1.0-1.4 J/cm$^2$, 1.1-1.4 J/cm$^2$, 1.1-1.3 J/cm$^2$, 1.0-1.5 J/cm$^2$, 1.0-1.4 J/cm$^2$, 1.0-1.3 J/cm$^2$, 1.2-2.0 J/cm$^2$, 1.2-2.8 J/cm$^2$, or 1.2-3.8 J/cm$^2$.

The substrate can be selected from any material that comprises a two-dimensional surface and possesses satisfactory atomic planeness and surface inertness. Exemplary substrates include, but are not limited to, highly ordered pyrolytic graphite (HOPG), graphene, hexagonal boronitride (BN), SiC, sapphire, mica, and other single crystal substrates.

The mica substrate can be fluorophlogopite ([KMg$_3$(AlSi$_3$O$_{10}$)F$_2$]). The mica substrate can also be selected from the group consisting of muscovite, phlogopyte, illite, zinnwaldite, lepidolite, paragonite, and biotite. In certain embodiments, the mica substrate is [KMg$_3$(AlSi$_3$O$_{10}$)F$_2$]. In certain embodiments, the mica substrate is exfoliated prior to use in the methods described herein.

The temperature of the substrate can be maintained between 200° C. and 400° C., 200° C. and 350° C., 250° C. and 350° C., 275° C. and 325° C., or 280° C. and 320° C. In the examples below the temperature of the substrate is maintained at about 300° C. The temperature of the substrate can be maintained at a substantially fixed temperature or varied between the aforementioned temperature ranges during the PLD process. After the deposition of the monolayer or few-layer crystalline black phosphorus film is complete, the temperature of the substrate can be cooled to room temperature, e.g., by removal of the substrate heat source and/or by venting an inert gas, such as nitrogen or argon, into the process chamber.

The predetermined distance the black phosphorus target is from the substrate can be less than 100 mm, less than 90 mm, less than 80 mm, less than 70 mm, less than 60 mm, less than 50 mm, or less than 40 mm. In certain embodiments, the predetermined distance the black phosphorus target is from the substrate is between 1 and 100 mm, 10 and 100 mm, 10 and 90 mm, 10 and 80 mm, 10 and 70 mm, 10 and 60 mm, 10 and 70 mm, 10 and 60 mm, 20 and 60 mm, 20 and 50 mm, 20 and 40 mm, or 30 and 40 mm. In the examples below, the predetermined distance the black phosphorus target is from the substrate is about 36 mm.

The process chamber can be evacuated with a vacuum pump (not shown), which is capable of maintaining the internal pressure of the process chamber below atmospheric pressure. In certain embodiments the pressure in the processing chamber is below $1.0\times10^{-6}$ Torr, below $1.0\times10^{-7}$ Torr, or below $1.0\times10^{-8}$ Torr. In certain embodiments the pressure in the processing chamber is between $1.0\times10^{-10}$ Torr and $1.0\times10^{-6}$ Torr, $1.0\times10^{-10}$ Torr and $1.0\times10^{-7}$ Torr, $1.0\times10^{-10}$ Torr and $1.0\times10^{-8}$ Torr, and $1.0\times10^{-9}$ Torr and $1.0\times10^{-8}$ Torr, $1.0\times10^{-9}$ Torr and $1.0\times10^{-7}$ Torr, $1.0\times10^{-9}$ Torr and $1.0\times10^{-6}$ Torr, $1.0\times10^{-9}$ Torr and $1.0\times10^{-5}$ Torr, or $1.0\times10^{-9}$ Torr and $1.0\times10^{-4}$ Torr. In the examples below, the pressure in the processing chamber is between about $1.0\times10^{-9}$ Torr.

Without wishing to be bound by theory, it is believed that the method described herein creates conditions in a confined region with extreme high-temperature and high-pressure conditions (e.g., over $10^3$ K and $10^9$ Pa) near the source surface. This confined region can exist temporarily inside the ultra-high vacuum chamber environment. It can facilitate the energetic BP cluster formation and transportation during the non-equilibrium process of PLD, and can significantly reduce the formation energy of BP phase and enables the subsequent wafer-scale growth of ultrathin 2D BP.

The monolayer or few-layer crystalline black phosphorus film may have a predominately crystalline structure. In certain embodiments, a crystalline structure of the monolayer or few-layer crystalline black phosphorus film may have an orthorhombic phase. In certain embodiments, the lattice structure of a crystal, for example, may be interrupted by cracks or impurities. In some embodiments, the film may be polycrystalline where crystalline regions are interrupted by grain boundaries. The grain boundaries may have a random and/or textured orientation. The crystalline regions may account for greater than 90% by volume of the film, in certain embodiments. In other embodiments, the crystalline regions may account for greater than 92%, 95%, 97%, 98%, 99%, or 99.9% of the volume of the film. In certain embodiments, the crystalline regions may account for a volume of the film in the range of 70% to 100%, 80% to 100%, 90% to 100%, 95% to 100%, 96% to 100%, 97% to 100%, 98% to 100%, 99% to 100%, 99.9 to 100%, or any value or range of values within those ranges.

Figure 2:
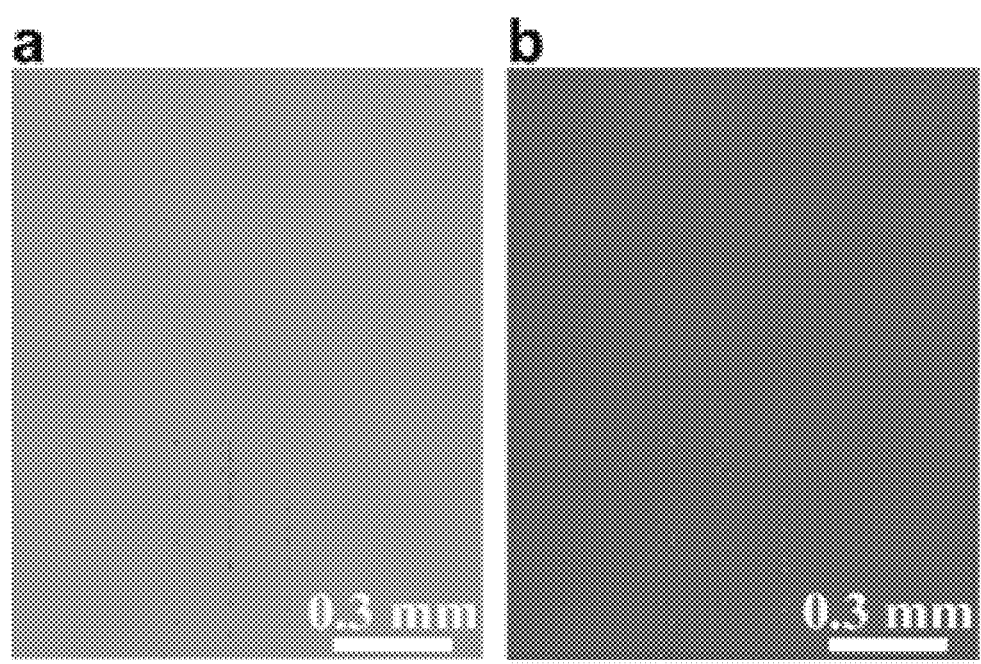
FIG. 2 depicts large-area investigations on few-layer BP films. (A)-(B) Inverse pore figure along z-axis (IPF-Z) and y-direction (IPF-Y) of a ~8-layer BP film, respectively, obtained from large-scale EBSD mapping. The differential color matching of IPF and dominant diffractive crystal plane are shown in (C). (D)-(F), Large-scale 0°-, 60°- and 90°-polarized Raman mapping on integrated intensity of $A^2_g$ peak of ~10-layer BP, respectively. The area with low Raman counts in lower right corner of each image represents mica substrate. The dotted circles in (F) indicate the distribution of inhomogeneous signals occurred in boundaries caused by domain misalignment. (G) Average PL mapping study composed of 36 scattered-point integrated-sampling results performed on top of a 3-layer BP film. Inset shows the photograph of the corresponding measured sample with scale instructions, from which the boundary between deposited BP-film and bare mica-substrate can be seen at the bottom right. (H) layer-dependent PL characteristics of few-layer BP films. (I) Raman spectra of few-layer BP. A slight left-shift is observed with increasing layer-number.
Figure 2:
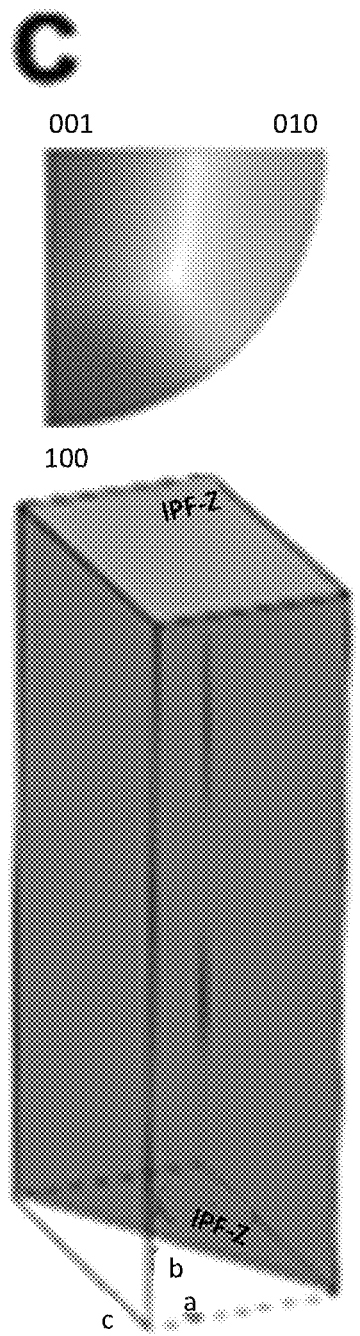
Figure 2:
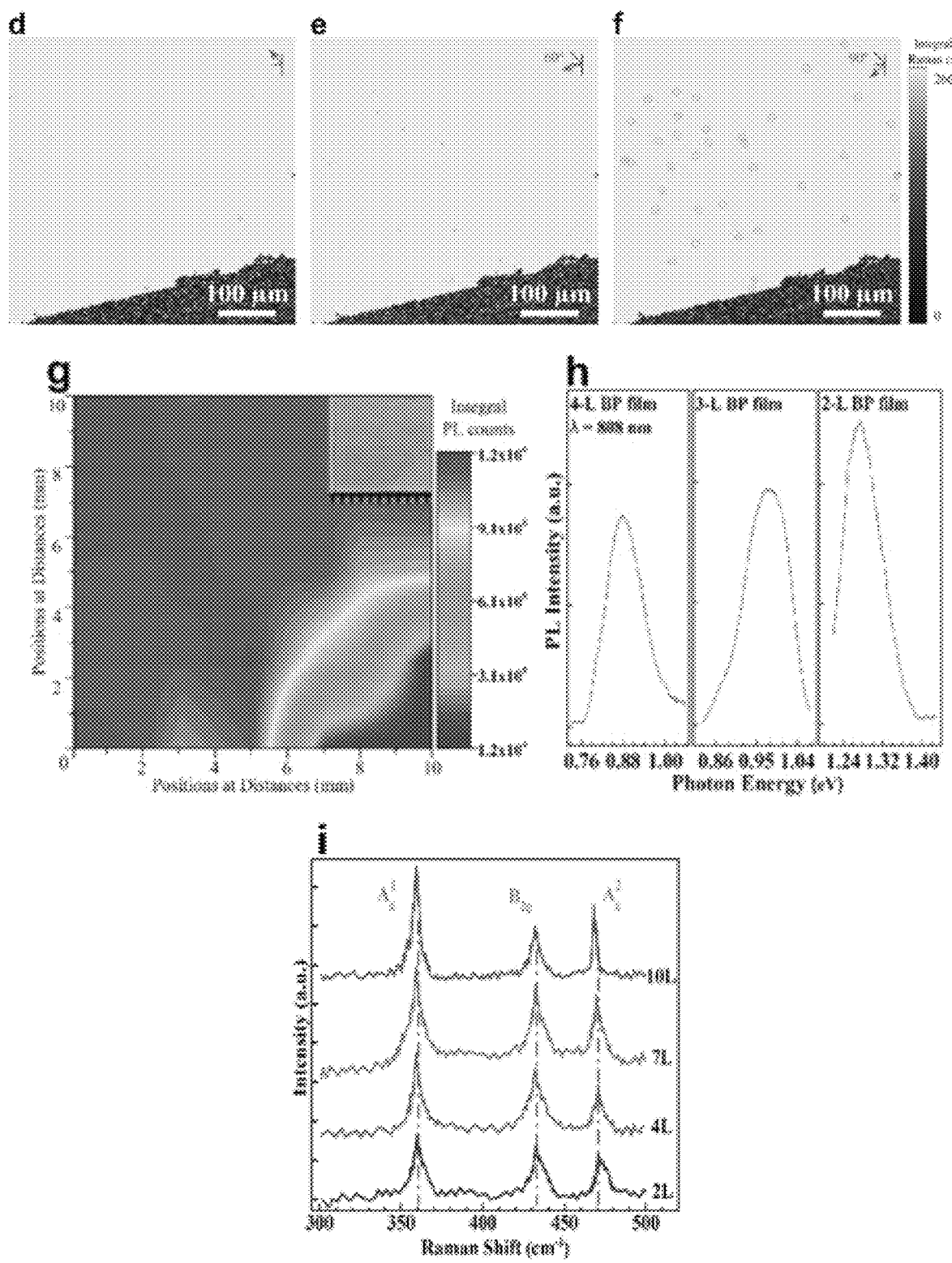

Referring to FIG. 2F, the resolution of the image of the few-layer crystalline black phosphorus film is 300×300 points, and the number of recognized defects is 36 points, according to which 0.04% of "defects per area" can be counted.

As a result of the highly uniform crystalline properties of the few-layer crystalline black phosphorous film, the few-layer crystalline black phosphorus film can have substantially the same bandgap ($E_g$) across the entire area of the few-layer crystalline black phosphorus film in cm scale. In certain embodiments, the bandgap ($E_g$) of a few-layer crystalline black phosphorus film can differ less than ±0.1%, ±0.2%, ±0.3%, ±0.4%, ±0.5%, ±0.6%, ±0.7%, ±0.8%, ±0.9%, ±1.0% across an area of 0.1-100 cm$^2$, 0.1-75 cm$^2$, 0.1-50 cm$^2$, 0.1-25 cm$^2$, 0.1-20 cm$^2$, 0.1-15 cm$^2$, 0.1-10 cm$^2$, 0.1-5 cm$^2$, 0.1-4 cm$^2$, 0.1-3 cm$^2$, 0.1-2 cm$^2$, 1-2 cm$^2$, 1-10 cm$^2$, 1-5 cm$^2$, 1-4 cm$^2$, 1-3 cm$^2$, 1-2 cm$^2$, 0.5-1.5 cm$^2$, 0.6-1.5 cm$^2$, 0.7-1.5 cm$^2$, 0.8-1.5 cm$^2$, 0.9-1.5 cm$^2$, 1.0-1.5 cm$^2$, 1.0-1.5 cm$^2$, 1.0-1.4 cm$^2$, 1.0-1.3 cm$^2$, 1.0-1.2 cm$^2$, 1.0-1.1 cm$^2$, or 0.9-1.2 cm$^2$ of the few-layer crystalline black phosphorus film.

The monolayer or few-layer crystalline black phosphorus film can have between 1-30 layers. In certain embodiments, the monolayer or few-layer crystalline black phosphorus film has 1-25 layers, 1-20 layers, 1-15 layers, 1-10 layers, 1-5 layers, 2-5 layers, 2-30 layers, 2-25 layers, 2-20 layers, 2-15 layers, 2-11 layers, 2-5 layers, 3-30 layers, 3-25 layers, 3-20 layers, 3-15 layers, 3-11 layers, 1-5 layers, 3-5 layers, 1-3 layers, or 2-3 layers.

In certain embodiments, the monolayer or few-layer crystalline black phosphorus film has a thickness of 0.5-18 nm.

The unique electronic properties of the monolayer or few-layer crystalline black phosphorus film prepared in accordance with the methods described herein make them useful in the fabrication of electronic devices. In certain embodiments, the electronic device is selected from the group consisting of a FET, computer memory, an integrated circuit, a diode, a transistor, laser mode-locking device, all-optical-signal processing devices and chips, ultra-high-speed flexible electronics, photovoltaic, photo thermoelectric, and thermal radiation sensor devices.

Figure 5:
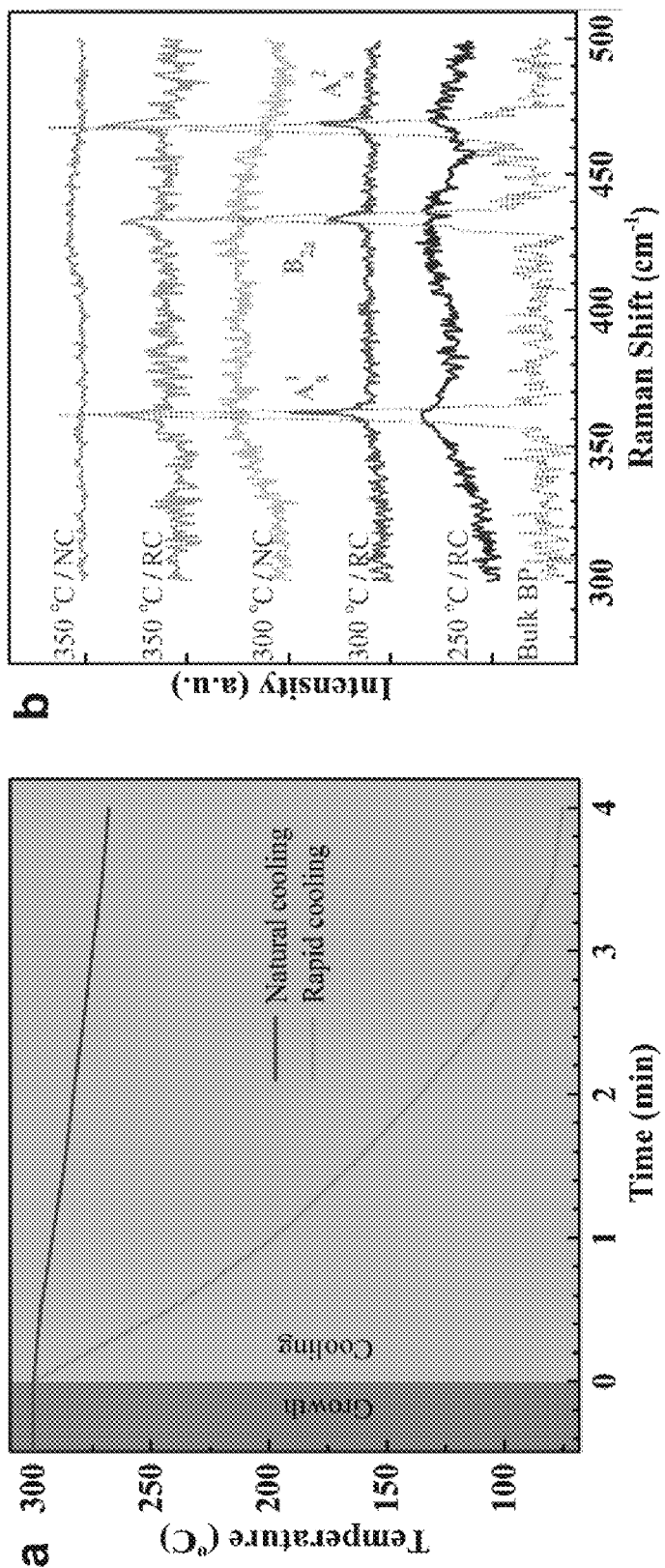
FIG. 5 depicts substrate-temperature control in pulsed laser deposition (PLD) process. (A) Comparison of cooling rate between natural cooling and rapid cooling. (B) Raman spectra of Black phosphorus (BP) ultrathin films grown at different temperature with various cooling strategies. 250°

Centimeter-scale BP growth in an ultrahigh-vacuum chamber was realized by using bulk mono-crystal BP as source and mica wafer with freshly exfoliated surface as substrate (FIG. 1A and FIG. 5). Different reflective color in contrast to bare mica can be observed for as-grown BP films (FIG. 1i), and the uniform sheen extends over the 1-cm$^2$ surface of mica wafer, signifying great potential for subsequent large-scale device-array fabrications. Additionally, precise control of film thickness (i.e., layer number) is readily achieved via manipulating the number of laser-pulses during deposition, and a growth rate of ~1.3 Å/s is deduced (FIG. 6). Taking advantage of the ultra-high homogeneity of atomic plane of mica surface and the uniform distribution of BP clusters in laser-generated physical-vapor, unidirectional growth and merging of monolayer BP flakes are thermodynamically preferred, facilitating the formation of a continuous BP film (FIGS. 1C-E and FIG. 7). The elemental composition and atoms coordination of obtained BP films were determined by energy-dispersive X-ray spectroscopy (EDX) mapping under high-angle annular dark-field transmission electron microscope (HAADF-TEM) and X-ray photoelectron spectroscopy (XPS) measurements. The signal of P element is uniformly distributed across the probed region (FIG. 1F-G). The weak signal from P—O bond (FIG. 1H) is believed to arise from a small amount of surface oxidation during the measurement. Hence, elemental purity of the as-prepared BP film is evidenced, and potential contaminations from oxidation can be ruled out.

To identify the large-area continuity and homogeneity of obtained BP films, a combination of X-ray diffraction (XRD), electron back-scatter diffraction (EBSD) and polarized Raman mapping measurements were employed. XRD pattern in FIG. 1I contains three main diffraction peaks of (0 2n 0) in addition to those of mica substrate. This fingerprint corresponds to the typical orthorhombic structure of BP crystal, which provides direct evidence on the large-scale high crystallinity of as-prepared BP films. Benefiting from the flat surface morphology of our sample, EBSD mapping was performed in millimeter scale to identify the crystallinity, orientation and uniformity. The EBSD orientation mapping results in FIG. 2A-C exhibit no distinct boundaries or azimuthal rotations of BP domains, confirming the highly crystal-orientated growth of orthorhombic BP along (010) direction. Further EBSD mapping studies were also performed on the samples with four different layer numbers (FIG. 8).

Large-area polarized Raman experiment in FIG. 2D-F provides further insight into the grain distribution of few-layer BP film. The characteristic lattice vibration of BP, $A^2_g$ mode with anisotropic features were focused on, in particular, to study the extended defects like dislocations and grain boundaries. Specially, a polarized 532-nm laser with three characteristic orientations of polarization state, 0°, 60° and 90°, respectively, was used. Given the high sensitivity of 90°-polarized Raman scattering to BP-crystal orientation, the observation of dispersive marks without visible grain boundary evidence the highly homogenous crystallographic orientation of BP grains. Further, Raman studies suggest that the angle-dependent anisotropic feature were highly uniform over the 1-cm size sample; and this crystallographic orientation homogeneity was observable as well at ultrathin thickness (FIG. 9). Photoluminescence (PL) mapping results (FIG. 2G), as further evidence, exhibit identical $E_g$ across the entire BP film in cm scale. It is noted that the layered dependent behavior observed in Raman and PL measurements is fully consistent with previous studies (FIG. 2H-I). By combining large-area diffraction techniques and optical spectroscopy measurements, these observations therefore reveal the highly uniform crystal orientation across the as-obtained BP sample in centimeter scale.

Figure 3:
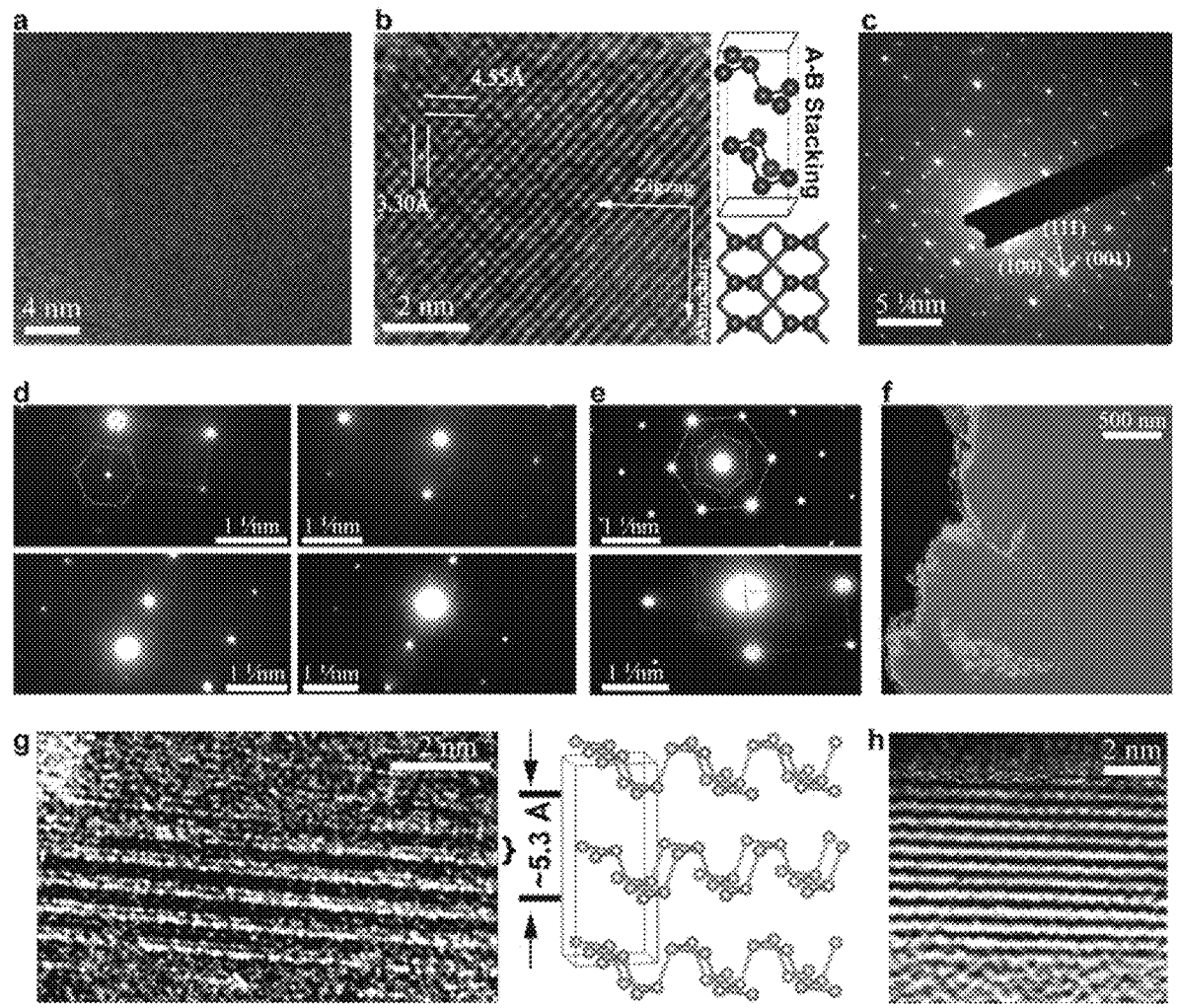
FIG. 3 depicts atomistic features of few-layer BP films. (A) Plan-view HR-TEM image of an 8-layer BP film. Defect-free atomic structure can be recognized. (B) Detailed HR-TEM image of BP lattice. The extracted lattice parameters match well with those of bulk BP single-crystal, and orthorhombic symmetry with AB stacking mode can be recognized, as illustrated by the inserted ball-stick schematics. Red and blue balls indicate upper and lower BP layers within a bilayer BP structure, respectively. (C) The corresponding SAED patterns. Crystalline features are demonstrated with zone-axis along [010] direction. (D) SAED patterns, related to four randomly selected sections of ~10-layer BP, taken under DF-TEM. Organized stacking of BP (red rectangle) and mica (orange hexagon) lattice can be concluded by referring to fingerprints of bare mica and BP in (E)-(F) Corresponding differential diffraction-filtered DF-TEM imaging. According to the defined SAED patterns in (D) mica-orientated region is filtered with orange, while BP-(010)-orientated region is in red, showing high homogeneity of crystal-orientation distribution. (G)-(H) Cross-sectional HR-TEM images of BP films with various layer-number. The inset shows the corresponding atomic structure of BP layers, which possesses unique puckered structure with a double atomic layer within one BP layer.

To investigate the microscopic crystal structure of as-grown BP films, high-resolution (HR-) TEM studies were performed. The plan-view image of a ~8-layer BP in FIG. 3A displays highly ordered arrangement of BP atoms without visible defects on as-grown film. A closer examination of the atomic arrangement pattern in FIG. 3B signifies lattice constant of 3.30 and 4.55 Å along zigzag and armchair directions, which matches well with orthorhombic structure of BP crystal. The inserted ball-stick schematic diagrams illustrate the atom arrangement of AB stacking structure from adjacent BP layers. The corresponding selected-area electron diffraction (SAED) patterns exhibit a typical orthogonal lattice with homologous quadruple symmetry, highly indicative of the crystalline nature of as-prepared sample (FIG. 3C). Furthermore, we used dark field (DF-) TEM diffraction-filtered measurement with large micrometer aperture filter to investigate the orientation of BP lattice on mica substrate. FIG. 3D displays diffraction patterns of randomly selected sections from the same BP sample. Here it was determined that there was identical lattice orientation between BP film (red rectangular shape) and mica substrate (orange hexagonal shape) by referencing to fingerprints of bare mica and BP (FIG. 3E); and this feature is highly homogenous over large-area BP film (FIG. 3F). This observation of highly oriented growth of BP lattice further proves the large-scale structure continuity of our BP film.

The longitudinal interlaminar structure of obtained BP films with various layer number was studied by cross-sectional TEM (FIG. 3G-H), where the well-defined layer structure can be recognized. The spacing between neighboring BP-layers was calculated to be ~0.53 nm, which is consistent with well-accepted values of ~0.52-0.56 nm. Specifically, the unique double-atom-layer characteristic of BP monolayer can be observed, and distinct stratification of mica substrate and each BP layer can be recognized via the van der Waals (vdW)-vacuum layers. Further TEM investigations (FIG. 10) suggest that deterioration may gradually occur on bottom BP-layers while the upper BP-layers continue to grow, which can be attributed to random deformation and shifting of BP layers happening under high temperature. Since a relatively high temperature of ~300° C. is required for the lateral growth of BP films, a rapid-cooling strategy after deposition was adopted, and the obtained large-area monolayer or few-layer BP films were adequate to satisfy further evolution of large-scale applications at atomistic thickness.

During the synthesis process of crystalline BP layers, it was found that the extreme high-temperature and high-pressure conditions created by laser-activated plasma cloud within the confined region near target surface were key to fulfill energetic BP-cluster formation and transportation during the non-equilibrium process of PLD (FIG. 11). To gain theoretical insights into the formation of BP clusters, MD simulations on the laser-activated behavior of surface BP layers on bulk target were conducted. A series of MD simulations were first performed in picosecond-scale on the continuously occurred ablation process of BP layers under various laser fluence (FIG. 12). Simulation results show that the temperature and pressure within laser-generated plasma-cloud could reach over $10^3$ K and $10^9$ Pa, respectively, which are highly desirable for BP-clusters formation. Radial distribution functions (RDF) (FIG. 13A-B) were obtained from MD simulations with various laser fluence, to investigate four characteristic peaks of interatomic interactions in BP structure. The RDF results indicate that the formation of BP clusters is likely to happen within the high-pressure region created by controlled low-fluence pulsed-laser, which subsequently facilitate the growth of BP film on substrate. As a step further toward the simulation of laser ablation in macroscale during one complete laser pulse, behaviors of BP clusters, including the formation and transportation in a complete timescale of one laser pulse were investigated (FIG. 13C-D). The results show that multi-layer BP is ablated from the target in several batches, each containing large BP clusters, under the optimal laser fluence, which is consistent with the observation in our picosecond-scale simulation. Accordingly, such a laser-activated physical vapor deposition (PVD) differing from conventional CVD and other PVD techniques is expected to be a feasible and powerful tool for the growth of large-scale monolayer or few-layer BP films based on our combined experimental and theoretical studies.

Figure 4:
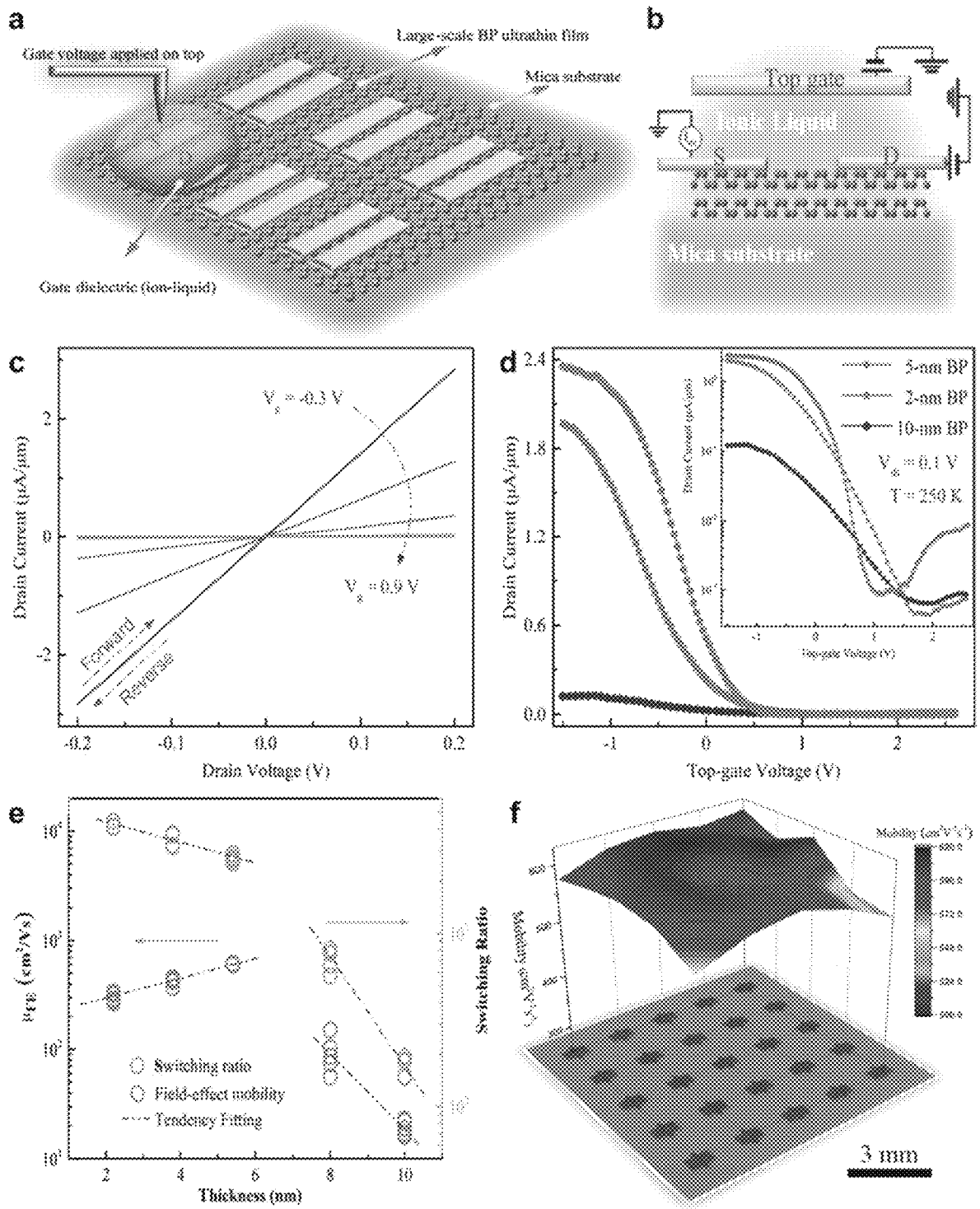
FIG. 4 depicts electrical performance of centimeter-scale few-layer BP. (A) Schematic of arrayed top-gated field-effect-transistors (FETs) based on centimeter-scale few-layer BP grown on mica substrate. (B) shows the cross-section view of a single FET. (C) A collection of $I_d$-$V_{ds}$ curves for a FET based on 5-nm BP ultrathin film under different gate voltage. (D) Transfer characteristics of the FETs based on 2-nm, 5-nm and 10-nm BP ultrathin films in linear scale at 250 K. The inset shows the same results in logarithmic scale. (E) Field-effect mobility and switching ratio resulted from the FETs as a function of BP-film thickness based on d and further repetitive experiments. (F) 3D color map of carrier mobility extracted from 25 FETs on the same BP sample, showing high uniform device performance. The optical image of arrayed devices on top of the BP sample with 1×1 cm$^2$ area is included in the figure.

Furthermore, FET is used to verify the electrical performance of as-grown BP. Benefiting from the considerable crystalline-size of as-grown BP, FETs were fabricated using hard-mask-based electron-beam deposition technology, which allows ready construction of electric devices to avoid possible contamination or oxidation. As shown in FIG. 4A-B, 10-nm-Pd/40-nm-Au multi-layer was used as electrodes. Notably, palladium was employed due to its good electrical conductivity and adhesion, as well as suitable work-function ($W_F$~5.2 eV) accompanying the Fermi energy of BP ($E_F$~4.9 eV) for constructing p-type FETs. FIG. 4C shows the gate-voltage-modulated current-voltage (I-V) output characteristics, from which linear correlation can be concluded for the Ohmic-contact between electrodes and BP layers. Further field-effect transfer performance was studied by utilizing ionic liquid as gate dielectric, from which the typical p-type transferring behaviors with outstanding electrical performances in terms of field-effect hole-mobility ($\mu_H$) and current-switching ratio were obtained (FIG. 4D, see more details in FIG. 14-16). It is worth noting that, BP samples with thickness below or above ~5 nm possess different electrical performance (FIG. 4E). For samples thinner than 5 nm, a linear proportional relationship was observed between carrier mobility and film thickness. The promotion of carrier mobility can be attributed to the narrowed bandgap of ultrathin BP layers, in accordance with previous studies on other semiconductors. Besides, scattering and screening effects of impurities in layered materials may also contribute to the thickness-dependent phenomenon. In contrast, as sample thickness exceeds 5 nm, a cliff-like drop of the carrier mobility emerges. Given that the inhibition of interlayer coupling is unlikely to produce such a significant effect in ultrathin films, the decrease of carrier mobility is therefore attributed to the deterioration of crystalline quality in thicker BP samples, as verified by the observed defects such as dislocation and grain boundaries under TEM. For current switching ratio, we observe a similar trend with an inflection point at 5 nm. The downtrend, for films thinner than 5 nm, is mainly due to the 2D nature of ultrathin films, that is, the modulation ability of gate voltage tends to be suppressed for thicker layers. As film thickness exceeds 5 nm, the deterioration of crystalline quality starts to affect the ON-current, causing a steeper slope of the curve. Notably, among all BP samples, the optimal performance of field-effect electrical transport properties is obtained at thickness of ~5 nm; and the carrier mobility reaches up to 213 and 617 $cm^2V^{-1}s^{-1}$ at 295 and 250 K, respectively. Such electrical performance is comparable to those exfoliated or CVD-grown BP-based FETs with similar thickness (FIG. 16D and FIG. 17). More importantly, unlike previously reported BP flakes with limited size, the BP films described herein exhibit highly uniform electrical performance in centimeter scale, according to carrier-mobility mapping results of 25 different locations on the wafer (FIG. 4F). This attribute is of high significance in breaking through the obstacles in scalable application of BP, and further lay the foundation for BP applications in electronic and optoelectronics.

In summary, controllable and rapid PLD process to directly synthesize monolayer or few-layered BP in centimeter-scale with high crystalline-quality and homogeneity is demonstrated herein. Combined with MD simulations, the growth mechanism of BP layer formation is understood. We investigate the crystal phase, crystalline quality, layered structure, and energy bandgap of as-prepared large-area-BP films. Following the success of growing large-area BP, few-layer BP FETs were fabricated. The large-scale-grown BP device array exhibits appealing electrical characteristics in terms of carrier mobility and current switching ratio. These attributes are comparable and even exceeding those of exfoliated or chemically grown BP flakes with similar thickness but much smaller scale (FIG. 17). Hence, the methods described herein are capable of fabricating large-area growth of monolayer or few-layer BP with lateral size in the centimeter range. It is worth noting that PLD enjoys attractive features beneficial to device fabrications including well-controllable thickness, stoichiometry growth, fast growth-rate, and high compatibility with making multi-layered hetero-structures simply via rotating multiple targets without breaking vacuum. In contrast to much smaller sized BP flakes fabricated by other approaches, the methods described herein open up the possibility of further developing BP-based wafer-scale electronic and optoelectronic devices, especially scalable integrated device-array and information system.

EXAMPLES

Growth of Monolayer or Few-Layer BP Films in Centimeter Scale

First, surface stripping was carried out on mica substrate before it was mounted in the growth chamber, which guarantees a fresh and spotless substrate surface for subsequent BP deposition. Afterwards, the source (BP single crystal, SMART-ELEMENTS) and [$KMg_3(AlSi_3O_{10})F_2$] substrate were placed face to face in the chamber, with a separation distance of ~36 mm. The chamber was then pumped to an ultrahigh vacuum level of ~1.6×10$^{-9}$ Torr, and mica substrate was heated up to 300° C. Upon the KrF excimer pulsed laser ($\lambda$=248 nm) with a pulse width of 10 ns, repetition rate of 5 Hz, irradiation diameter of ~2.5 mm, and a laser fluence of 1.2 J/cm$^2$, plasma plume containing large BP clusters was generated from the target. The physical vapor containing ablated clusters was then transmitted towards the surface of mica substrate and monolayer or few-layer BP film was formed under controlled substrate temperature. Mica substrates were kept rotating during the growing process to achieve uniform deposition, while BP source was fixed to maintain the uniformity and stability of plasma plume. After deposition, the temperature of as-synthesized BP films was immediately and rapidly decreased down to room temperature (RT) by venting dry N$_2$ gas into the growth chamber and moving the sample holder away from heater. To prove the effectiveness of the rapid-cooling approach, a comparison of cooling rates between natural and rapid cooling was experimentally performed, as exhibited in FIG. 5, where the cooling rate is significantly promoted for rapid-cooling strategy. In order to avoid degradation of as-prepared monolayer or few-layer BP films, transferring samples for subsequent studies was implemented using sealed containers filled with protection gas.

Bulk black phosphorus (BP) single crystal was used as the source material for the deposition to inhibit the ejection of heterogeneous large particles or droplets, which renders the formation of BP films with well-defined morphology. Regarding the substrate for deposition, freshly exfoliated [KMg$_3$(AlSi$_3$O$_{10}$)F$_2$] was used to facilitate epitaxial growth of BP film. Recently, mica substrate has been considered as a promising candidate for vdW-epitaxial growth of 2D materials. Owing to the 2D nature of mica, its freshly exfoliated surface possesses satisfactory atomic planeness and surface inertness, allowing a low migration barrier energy (E$_m$) for 2D material growth.

Growth of Monolayer MoS$_2$ Triangle

MoS$_2$ nanosheets of fine triangular shape were synthesized by CVD method. A powder mixture of 10 mg MoO$_3$ and 5 mg NaCl in a quartz boat was placed in center of the quartz tube. 20 mg of sulfur powder was placed on the upstream of the furnace at 180° C. Prior to crystal growth, the quartz tube was vacuumed below 6 Pa and flushed with Ar carrier gas. The furnace was then heated to the growing temperature (750° C.) with a ramp rate of 15° C. min$^{-1}$ and held for 10 min before cooling down to RT naturally. Ar carrier gas with a flow rate of 60 sccm was used to facilitate crystal growth.

Model Settings of MD Simulations

MD simulation was performed using Large-scale Atomic/Molecular Massively Parallel Simulator (LAMMPS) to simulate the laser influence during PLD process. BP layer was modelled with active layers on the top and two fixed layers at the bottom. Laser heating was simulated by imposing a constant heat fluence to active BP-layers, while keeping the position of fixed layers stationary. Periodic boundary conditions were imposed along the in-plane x- and y-directions to eliminate the edge effect, and a vacuum layer with sufficient thickness was applied along the out-of-plane z-direction. Stillinger-Weber (SW) potential was implemented in the simulations to define the intra-layer P—P bonds. The parametrization of SW potential for phosphorene was based on ab initio valence force field (VFF) model by Jiang et al[39]. For the interlayer interactions between adjacent BP layers, the 12-6 Lennard-Jones (LJ) potential was employed:

$$V(r) = 4\varepsilon\left[\left(\frac{\sigma}{r}\right)^{12} - \left(\frac{\sigma}{r}\right)^{6}\right] \tag{1}$$

where r is the separation between two particles. The energy constant E and distance constant $\sigma$ are obtained from the universal force field[40], where $\varepsilon$=0.0132 eV and $\sigma$=3.695 Å. The cutoff distance for the LJ potential is set as 15 Å.

During the simulation, a time step of 0.5 fs was used to integrate the equations of motion. The initial configuration first undergoes energy minimization at 0 K with the conjugate gradient method. System equilibration was then carried out at 300 K with Nose-Hoover thermostats to release internal stresses in BP structure. Upon equilibration, the system was switched to micro-canonical ensemble (i.e., NVE ensemble, where N, V, and E refer to constant number of particles, volume, and total energy, respectively) for laser heating. For the simulation of the continuous ablation of BP segments from target, BP with lateral dimension of 100 Å×100 Å with 2 active layers and 200 Å vacuum layer was modelled. Laser heating was lasted for 10 picoseconds for the ablation of segments before cluster-formation simulations. With the effect of laser heating, the ablated phosphorus segments were extracted for BP-cluster formation. To simulate dynamic bond creation, a harmonic bond potential was defined according to the VFF model[41]. The bond-stretching and angle-bending potentials can be described by:

$$V_r = \frac{1}{2}K_r(r - r_0)^2 \tag{2}$$

$$V_\theta = \frac{1}{2}K_\theta r_1 r_2 (\theta - \theta_0)^2 \tag{3}$$

where $K_r$ and $K_\theta$ are valence force constants; $r_0$ and $\theta_0$ are equilibrium bond and angle, respectively. Accordingly, we used $r_0$=2.224 Å and $K_r$=7.578 eV/Å$^2$ for bonds, $\theta_0$=96.359° and $K_\theta$=0.818 eV/Å$^2$ for Angle I (zigzag), and $\theta_0$=102.090° and $K_\theta$=0.710 eV/Å$^2$ for Angle II (armchair), respectively, in our simulations[41]. Here we assume all the bonds in BP structure have identical length and stretching parameters. The LJ potential was adopted to define the vdW force among all the phosphorus atoms. To guarantee the ablated segments reaching steady state, the system was equilibrated before data collection. The RDF was obtained by averaging multiple measurements in the steady state.

For the MD simulation of laser ablation over one complete laser pulse, BP target surface was imitated using 48 active layers which guarantees no residue of laser energy within one laser pulse. A 14000 Å vacuum layer was applied along the out-of-plane direction to enable thorough transportation of BP clusters. The laser heating was lasted for 2 ns. The atomistic data from MD simulations were visualized and analyzed using OVITO package.

Material Characterization Methods

Raman investigations were carried out by high-resolution confocal $\mu$-Raman systems (Horiba HR 800 and Witec alpha300 R) equipped with 488 and 532 nm laser source. To preserve the crystalline structure of BP samples, the investigated samples were placed in a ~10$^{-1}$ Torr vacuum capsule with a transparent test-window, and the laser power through a ×100 (NA=0.9) objective was controlled at a low level of ~1 µW. Accordingly, the optical resolution of Raman microscope is ~360 nm (for $\lambda$=532 nm) and ~330 nm (for $\lambda$=488 nm). The thickness and surface morphology of the monolayer or few-layer BP films were studied by a commercial atomic force microscope (Asylum Research MFP-3D). PL measurement was conducted by an FLS920P Edinburgh Analytical Instrument apparatus equipped with 808-nm diode laser (MDL-808) as an excitation source. The crystal structure of as-prepared sample was characterized by X-ray diffraction (Rigaku smart lab 9 kW, Japan) with Cu Kα radiation ($\lambda$=1.5406 Å). XPS was obtained from the Thermo Scientific Nexsa X-Ray Photoelectron Spectrometer System equipped with a Monochromatic and focused 12 kV aluminum Kα x-ray source. Scanning electron microscope (SEM) and EBS images were obtained from Tescan VEGA3 Scanning Electron Microscope, with the electron-voltage controlled at 5 kV. EBSD measurement was carried out under Field Emission Gun-(FEG-) SEM (LEO 1530) equipped with EBSD system (Oxford Instruments NordlysNano EBSD Detector with AZtecHKL), with fine adjustment on tilt-angle between 60.7° and 70.3°, and electron-voltage controlled at 20 kV. Before EBSD measurement, the bottom mica is reduced via tape exfoliation. Then, 10-nm conductive carbon layer was constructed into gridded frames on top of sample via mask-assisted deposition, and conductive silver paste is used to cover the boundary between sample and holder. Such construction process aims to reduce the surface electron accumulation during measurement, while less intrusive signals can be obtained on the regions exposed from the grid. The micro-structures and chemical compositions of as-prepared BP films were further investigated by field-emission scanning transmission electron microscopy (FE-STEM, JEOL Model JEM-2100F) equipped with an energy dispersive X-ray spectroscopy, using 100-kV accelerating voltage and 0.3-s exposure time. For the differential diffraction-filtered color-imaging used for dark-field TEM mapping, regions with mica-orientated signal are filled in orange, while those with BP-(010)-orientated signal are filled in red, according to the previously defined electron diffraction patterns of each lattice. By stacking the constructed bitmaps together, the area with homogeneous crystal-orientation of BP and mica can be concluded, while boundaries and vacuum (or carbon membrane) can be seen in dark color. Specimens for HR-TEM measurements were prepared by polystyrene (PS)-mediated transfer approach with ethanol-assisted lift-off. Specimens for cross-section TEM measurements were obtained by applying focused ion-beam (FIB, JEOL JIB-4500) milling and lift-off technique. All the obtained samples were transferred onto copper grids for TEM characterization.

Device Fabrication Methods

Followed by the deposition and the rapid-cooling process, mica-based monolayer or few-layer BP films were covered with hard-mask templates (made of highly purified molybdenum) with designed patterns and transferred into the electron-beam deposition (EBD, Denton Vacuum E-beam Explorer System) chamber with dry $N_2$ protection. Then, 10-nm-Pd/40-nm-Au metal contact multilayer was deposited on the top of BP films to form the source, drain, and gate electrodes. The growth rates of Pd and Au layers were carefully controlled at 0.2 and 0.7 Å/s, respectively, to avoid potential damage on the surface of BP layers. Typically, the channel length ($L_{ch}$) of obtained FETs is 40 m, while the channel width ($W_{ch}$) is 400 μm. Prior to the measurement, one droplet of ionic liquid (IL, using DEME-TFSI, Sigma Aldrich 727679) was carefully positioned on the top of the construction using a micro-manipulator under optical microscope, covering source, drain and gate electrodes. After dehydration, an IL gate-dielectric layer was formed by self-assembly, yielding a top-gated FET.

Device Characterization Methods

After fabrication, the devices were cooled down to 250 K and hold for a few minutes in vacuum of $6 \times 10^{-7}$ Torr before being characterized, so as to freeze water in the ionic liquid. Although the applied voltage is relatively low in the experiment, this designed low-temperature test can further exclude the possibility of water electrolysis during the measurement, which may cause degradation of intrinsic electrical properties of BP. Device characterization was carried out at 250 K by using Keithley 4200 Semiconductor Parameter Analyzer equipped with a probe station connected with vacuum chamber, liquid-helium cryogenic test platform, micro-manipulator with 5-μm tips, and optical microscope. It is worth noting that, to demonstrate the sheer electrostatic field-effect phenomena and avoid any interfacial electrochemical reaction or intercalation, the electrical characteristic displayed in the main text was measured within a recognized electrostatic working-window of DEME-TFSI with low temperature of ~250 K and small voltage of less than 2 Volts. Additionally, because the semiconductor devices are usually operated at RT in real applications, we also make a further step to study the RT performance of our BP-based FETs (FIG. 16A-B). Since the theoretical electrolytic voltage of water is around 1.5 V (greater than 2.1 V if heat balance is considered), the performance of the devices was verified within a voltage range smaller than this critical value, that is, the voltage that ensures the water is not ionized. The characterization was conducted in dark environment to prevent ambient light influence on the measured electrical properties of BP.

Capacitance-Density Determination of Ionic-Liquid

To guarantee the accuracy and reliability of electrical performance measurements, relatively stable and conventional $MoS_2$ nanosheets were employed for comparison. Analogues to the structure of BP-based top-gated FETs, this $MoS_2$-based device was constructed using CVD-grown triangular $MoS_2$ samples on 300 nm $SiO_2$/Si substrates. FIG. 14 shows the determination process of capacitance density of the ionic liquid droplet. As shown in FIG. 14C, the underlying silicon layer acts as back-gate electrode of the FET by using 300-nm $SiO_2$ as the dielectric, while the Pd/Au electrodes deposited on top of the $MoS_2$ act as the source, drain and top gate by using ionic-liquid that dropping on top of these three electrodes as the dielectric. When drain voltage ($V_{ds}$) and top-gate voltage ($V_{tg}$) are applied on the FET, the transfer characteristic curve can be obtained (FIG. 14D). FIG. 14E shows the evolution of the FET output curve when back-gate voltage ($V_{bg}$) is applied, in which the most affected parameter is the threshold voltage ($V_{th}$) in $I_{ds}$-$V_{tg}$ curves. As $V_{bg}$ gradually increases from 0 to 30 V, the corresponding $V_{th}$ systematically shifts to the negative $V_{tg}$ position, while the slope of the $I_{ds}$-$V_{tg}$ curves within the linear work-region remains nearly constant. The estimation of the capacitance of ion-liquid ($C_{tg-IL}$) is based on the change of $\Delta V_{th}$ in response to the variation of $\Delta V_{bg}$:

$$C_{tg\text{-}IL}/C_{bg} = V_{bg}/\Delta V_{th} \tag{4}$$

where $C_{bg}$=1.2×10$^{-8}$ F/cm$^2$ is the capacitance-per-unit-area of the $SiO_2$ (back-gate dielectric), and $\Delta V_{bg}/\Delta V_{th}$=120 is extracted through linear fitting (see FIG. 14F). Accordingly, the capacitance of the ion-liquid droplet per unit area is estimated to be $C_{tg\text{-}IL}$~1.44×10$^{-6}$ F/cm$^2$.

Calculation of the Field-Effect Mobility

The field-effect carrier mobility ($\mu_{FE}$) of the large-scale few-layer BP films can be extracted from transport characteristic curves of the top-gated FETs:

$$\mu_{FE} = \frac{L}{WC_{tg-IL}V_{ds}} \frac{dI}{dV} \quad (5)$$

where L is the channel length (40 µm), W is the channel width (400 µm), $C_{tg-IL}$ is the capacitance density of ionic liquid (1.44×10$^{-6}$ F/cm$^2$), $V_{ds}$ is the applied drain voltage, and dI/dV is the field-gating efficiency obtained by matching the slope of the curve within the linear work-region. Due to the fixed dosage of ionic liquid employed in the device fabrication, the contributing capacitance density used for mobility calculation can be considered as a constant[43].

Construction of Back-Gated BP MOSFET Through Encapsulated Transfer

FIG. 15 shows the construction process of back-gated BP FET conducted in a dry glovebox filled with high-purity nitrogen. After the growth of large-scale BP ultrathin film on mica substrate through PLD, the device arrays with Pd/Au electrodes were fabricated through electron-beam deposition. Then, pre-prepared h-BN film was located on top of the constructed BP devices through dry-transfer process to form an encapsulation layer, and the top surface of the sample was coated with PVA/PMMA supporting membrane. Notably, the size of the PVA membrane should be larger than that of the sample, in order to keep the sample suspended in the ethanol during subsequent process. Afterwards, the sample was gently immersed into ethanol and kept the mica in suspension. Since the mica substrate and the BP film are bound together by vdW forces, the ethanol is able to slowly penetrate into their interface and separate them. Under the force of gravity, mica tends to sink into the ethanol, while the PVA/PMMA-supported sample remain in suspension, further increasing the stripping rate in between. When the mica sank completely, it was removed and placed a new SiO$_2$/Si substrate under the suspended sample. Finally, a syringe was used to slowly draw the ethanol away, allowing the sample to be released flat onto the target substrate to construct back-gated BP FET arrays after drying and fixation.

Notes for the Output Analysis of MD Simulations

In consistence with the experiments, five typical laser-fluence conditions (0.8, 1.2, 2.0, 2.8 and 3.8 J/cm$^2$) were used to investigate the atomic structure evolution under laser heating through MD simulation. From the output results (FIG. 12), it can be recognized that the formation of large phosphorus clusters only occurs under relatively low laser energy. Both 0.8 and 1.2 J/cm$^2$ laser fluences render the formation of phosphorus clusters back to BP clusters, verified by the characteristic puckered structure of BP. At a laser fluence of 0.8 J/cm$^2$, however, the amount of ablated phosphorus is essentially small, which is not applicable for large-scale film growth. At a laser fluence of 1.2 J/cm$^2$, many of the ablated phosphorus segments retain the unique structure of BP, thus yielding considerable amounts of phosphorus clusters with BP characteristics. Under this condition, larger BP clusters exhibit dense and uniform distribution in the plasma cloud, rendering the formation of large-scale BP films after a vapor-phase transmission process. As the laser fluence increases to higher levels, the ablated P ions fail to order themselves into BP structures due to the excessively high kinetic energy. The amount of resulting BP-like clusters decreased dramatically, while the discretely scattered P ions are observed. As the laser fluence further increases to 3.8 J/cm$^2$, the energy of the system is exceptionally high, and the ions oscillate dramatically. Therefore, the plasma mainly consists of highly disordered P ions in random distribution and barely any cluster can be observed.

To further validate the molecular dynamic process, the radial distribution functions (RDF), g(r), was investigated for structural characterization. RDF describes the probability of finding an atom as a function of distance from the reference atom. Typically, the sharp peaks represent fixed distances characterizing the crystalline nature of the material while smooth features represent disordered or amorphous state of the material. FIG. 13A depicts the RDF curves extracted from MD simulation processes with varying laser fluence, from which five characteristic peaks can be recognized as fingerprints to verify the formation of BP clusters. The first peak I centered at ~2.23 Å represents the covalent bonding distance between adjacent P atoms, which corresponds to the nearest neighbor (e.g., 1-2, 2-4) in BP structure. This peak is a two-body interaction and can be observed for all laser conditions, indicting a certain trend of evolution towards BP clusters. In contrast, another peak centered at ~3.40 Å is only observed under lower-laser-fluence conditions. This broad peak contains information about three characteristic distances, II, III and IV, indicating the three-atom zigzag, four-atom armchair, and three-atom armchair features of BP, respectively. They are responsible for the fingerprints of BP allotrope involving characteristic many-body terms, which renders the distinction between different phosphorus allotropes. The absence of these three characteristics under high laser-energy conditions implies that the formation of BP clusters is inhibited. The flat peak centered at ~4.15 Å represents the vdW interaction between P atoms without chemical bonding. This peak grows dramatically under high laser-energy conditions, indicating considerable amount of free P atoms in the system. Interestingly, the radial distribution after 10 Å exhibits a higher intensity with higher energy conditions, further evidencing the random distribution and highly disordered of P ions caused by higher laser-energy.

To further validate the characteristic fingerprints of BP structure, the broad peak centered at ~3.40 Å was differentiated and imitated into three individual peaks, II, III, and IV, representing the second neighbor (e.g., 1-3, 5-7; d_2≈3.31 Å), third neighbor (e.g., 2-6, 2-8; d_3≈3.45 Å), and fourth neighbor (e.g., 2-5, 4-6; d_4≈3.53 Å), respectively (see FIG. 13B). These characteristic peaks can be explained by the valence force field (VFF) model for BP structure. The second and fourth neighbors are related to three-body interactions which involve Angle I (zigzag) and Angle II (armchair), respectively (see Equation No. 2). The third neighbor is related to four-body interaction, which contains a sequence of four atoms with a full armchair structure (e.g. 2-4-5-6). To characterize the formation of BP-like clusters, the peak intensities of two-body interaction and many-body interaction for zigzag and armchair configurations were extracted. As shown in FIG. 12F, all the RDF peaks have highest proportions at 1.2 J/cm$^2$, especially for peaks related to the unique many-body interactions in BP structure. It means that the ratio of BP-like clusters reaches maximum under this laser fluence, which is consistent with our experimental findings. Accordingly, one can conclude that a laser fluence of ~1.2 J/cm is optimal for BP synthesis in our PLD process.

What is claimed is:
1. A method for preparing a monolayer or few-layer crystalline black phosphorus film, the method comprising:
   a. positioning a substrate in a process chamber, wherein the substrate comprises a two-dimensional deposition surface;

b. positioning a black phosphorus target in the process chamber a predetermined distance from the substrate; and c. focusing a pulsed laser beam of a predetermined energy density on the black phosphorus target to ablate the black phosphorous target thereby forming a plume comprising phosphorus plasma directed towards the two-dimensional deposition surface thereby forming the monolayer or few-layer crystalline black phosphorus film.

2. The method of claim 1, wherein the substrate is selected from the group consisting of mica, highly ordered pyrolytic graphite (HOPG), graphene, hexagonal boronitride (BN), SiC, and sapphire.

3. The method of claim 1, wherein the pressure in the processing chamber is below $1.0 \times 10^{-5}$ Torr.

4. The method of claim 1, wherein the temperature of the substrate is maintained between 250° C. and 350° C.

5. The method of claim 1, wherein the laser fluence of the pulsed laser beam is 0.8-5.0 J/cm$^2$.

6. The method of claim 1, wherein the predetermined distance of the black phosphorus target and the substrate is between 10 and 100 mm.

7. The method of claim 1, wherein the black phosphorus target is a black phosphorus single crystal.

8. The method of claim 1, wherein the monolayer or few-layer crystalline black phosphorus film is between 2-20 layers thick and comprises a single crystalline region over at least 90% of an area of 0.1-100 cm$^2$.

9. The method of claim 1 further comprising removing the substrate from the monolayer or few-layer crystalline black phosphorus film.

10. The method of claim 1, wherein the method comprises:

a. positioning the substrate in the process chamber, wherein the substrate comprises a deposition surface;

b. positioning a black phosphorus single crystal target in the process chamber between 20-55 mm from the substrate; and c. focusing the pulsed laser beam having a laser fluence between 0.8-1.6 J/cm$^2$ on the black phosphorus single crystal target to ablate the black phosphorous single crystal target thereby forming a plume comprising phosphorus plasma directed towards the deposition surface thereby forming the monolayer or few-layer crystalline black phosphorus film, wherein the pressure of the process chamber is maintained between $1.0 \times 10^{-10}$ Torr and $1.0 \times 10^{-5}$ Torr.

11. The method of claim 10, wherein the black phosphorus single crystal target in the process chamber between 30-40 mm from the substrate.

12. The method of claim 10, wherein the laser fluence is between 1.0-1.5 J/cm$^2$.

13. The method of claim 10, wherein the temperature of the substrate is maintained between 250° C. and 350° C.

14. A method for preparing a few-layer crystalline black phosphorus film, the method comprising:

a. positioning a [KMg$_3$(AlSi$_3$O$_{10}$)F$_2$] substrate in a process chamber, wherein the [KMg$_3$(AlSi$_3$O$_{10}$)F$_2$] substrate comprises a deposition surface;

b. positioning a black phosphorus single crystal target in the process chamber between 30-40 mm from the [KMg$_3$(AlSi$_3$O$_{10}$)F$_2$] substrate; and c. focusing a pulsed laser beam having a laser fluency between 1.0-1.5 J/cm$^2$ on the black phosphorus single crystal target to ablate the black phosphorous single crystal target thereby forming a plume comprising phosphorus plasma directed towards the deposition surface thereby forming the few-layer crystalline black phosphorus film, wherein the few-layer crystalline black phosphorus film is between 2-6 layers thick and comprises a single crystalline region over at least 90% of an area of 1 cm$^2$, and wherein the pressure of the process chamber is maintained between $1.0 \times 10^{-10}$ Torr and $1.0 \times 10^{-8}$ Torr.

15. The method of claim 14, wherein the temperature of the [KMg$_3$(AlSi$_3$O$_{10}$)F$_2$] substrate is maintained between 275° C. and 325° C.

* * * * *